(12) United States Patent
Wu et al.

(10) Patent No.: US 12,639,503 B2
(45) Date of Patent: May 26, 2026

(54) AUTOMATIC ROBUST OPTIMIZATION OF CIRCUITS

(71) Applicant: International Business Machines Corporation, Armonk, NY (US)

(72) Inventors: Chai Wah Wu, Hopewell Junction, NY (US); Ann Chen Wu, Hopewell Junction, NY (US); James Strom, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 1121 days.

(21) Appl. No.: 17/177,502

(22) Filed: Feb. 17, 2021

(65) Prior Publication Data

US 2022/0261654 A1    Aug. 18, 2022

(51) Int. Cl.

| | |
|---|---|
| *G06F 30/398* | (2020.01) |
| *G06F 17/11* | (2006.01) |
| *G06F 30/27* | (2020.01) |
| *G06F 30/373* | (2020.01) |
| *G06N 3/0499* | (2023.01) |
| *G06N 3/08* | (2023.01) |
| *G06N 3/09* | (2023.01) |
| *G06N 5/01* | (2023.01) |
| *G06N 3/065* | (2023.01) |

(Continued)

(52) U.S. Cl.
CPC ............ *G06F 30/398* (2020.01); *G06F 30/27* (2020.01); *G06F 30/373* (2020.01); *G06N 3/0499* (2023.01); *G06N 3/08* (2013.01); *G06N 3/09* (2023.01); *G06N 5/01* (2023.01); *G06F 17/11* (2013.01); *G06N 3/065* (2023.01); *G06N 3/126* (2013.01); *G06N 7/01* (2023.01)

(58) Field of Classification Search
CPC ........ G06F 30/398; G06F 30/27; G06F 30/31; G06F 30/373; G06F 17/11; G06F 2111/06; G06F 2111/08; G06N 3/08; G06N 5/01; G06N 3/065; G06N 3/126; G06N 7/01; G06N 3/0499; G06N 3/09
USPC .......................................................... 703/14
See application file for complete search history.

(56) References Cited

U.S. PATENT DOCUMENTS

| | | | |
|---|---|---|---|
| 5,465,204 A | 11/1995 | Sekine et al. | |
| 9,915,963 B1 * | 3/2018 | Wu ......................... | G05F 1/575 |

(Continued)

FOREIGN PATENT DOCUMENTS

| | | |
|---|---|---|
| CN | 109977534 A | 7/2019 |
| CN | 110069805 A | 7/2019 |

(Continued)

OTHER PUBLICATIONS

Zhang, Guo, Hao He, and Dina Katabi. "Circuit-GNN: Graph neural networks for distributed circuit design." International conference on machine learning. PMLR, 2019. (Year: 2019).*

(Continued)

*Primary Examiner* — John E Johansen
(74) *Attorney, Agent, or Firm* — CANTOR COLBURN LLP; Andre L. Adkins

(57) ABSTRACT

Embodiments of the invention are directed to using a trained machine learning model to generate predicted circuit data for a circuit design, and computing an objective function using the predicted circuit data. Optimization of the objective function is performed to generate an optimal solution, and the optimal solution is mapped to the circuit design.

25 Claims, 18 Drawing Sheets

(51) Int. Cl.
| | |
|---|---|
| *G06N 3/126* | (2023.01) |
| *G06N 7/01* | (2023.01) |

(56) References Cited

U.S. PATENT DOCUMENTS

| | | | | |
|---|---|---|---|---|
| 10,817,634 | B2 | 10/2020 | Oh | |
| 10,970,441 | B1 * | 4/2021 | Zhang | G06N 3/063 |
| 11,354,472 | B2 * | 6/2022 | MacRae | G06F 30/398 |
| 2005/0257178 | A1 * | 11/2005 | Daems | G06F 30/30 |
| | | | | 716/132 |
| 2009/0307636 | A1 | 12/2009 | Cases et al. | |
| 2017/0330072 | A1 | 11/2017 | Liao et al. | |
| 2020/0320366 | A1 | 10/2020 | Wang et al. | |
| 2020/0342344 | A1 | 10/2020 | Gambetta et al. | |
| 2021/0247839 | A1 * | 8/2021 | Pathak | G06F 1/324 |

FOREIGN PATENT DOCUMENTS

| | | | |
|---|---|---|---|
| CN | 111651948 A | 9/2020 | |
| WO | 2020165688 A1 | 8/2020 | |
| WO | WO-2020183059 A1 * | 9/2020 | G06N 3/084 |

OTHER PUBLICATIONS

Shoniker, Michael, et al. "Automatic selection of process corner simulations for faster design verification." IEEE Transactions on Computer-Aided Design of Integrated Circuits and Systems 37.6 (2017): 1312-1316. (Year: 2017).*

Barros,, "Analog circuits optimization based on evolutionary computation techniques," Integration, vol. 43, Issue 1, 2010, 20 pages.

Bengio, "Deep Learning," Nature, vol. 521, No. 7553, p. 436, 2015. 10 pages.

D. Beece, "Transistor sizing of custom high-performance digital circuits with parametric yield considerations," Optimization and Engineering, vol. 15, pp. 217-241, 2014. 6 pages.

Djeffal, "An analytical approach based on neural computation to estimate the lifetime of deep submicron MOSFETs", Semicond. Sci. Technol. 20 (2005) 158-164; 8 pages.

Gardner, "Charge-pump phase-lock loops," IEEE Transactions on Communications, vol. 28, pp. 1849-1858, 1980. 10 pages.

Kahng, "Machine learning applications in physical design: recent results and directions," in Proceedings of the 2018 International Symposium on Physical Design, pp. 68-73, 2018. 6 pages.

Kennedy "Particle swarm optimization," in Proceedings of ICNN'95-International Conference on Neural Networks, vol. 1, pp. 1942-1948, IEEE, 1995. 7 pages.

Lee, "Accelerate Innovations in Robust Circuit Design with Python API to Circuit Simulation," 2018 14th IEEE International Conference on Solid-State and Integrated Circuit Technology (ICSICT), Qingdao, 2018, 4p.

Liu, "Synthesis of Integrated Passive Components for High-Frequency RF ICs Based on Evolutionary Computation and Machine Learning Techniques," in IEEE Transactions on Computer-Aided Design of Integrated Circuits and Systems, vol. 30, No. 10, Oct. 2011. 11p.

Mirhoseini, "Chip Placement with Deep Reinforcement Learning," arXiv: 2004.10746, 2020. 15 pages.

Rayas-Sanchez, "EM-based optimization of microwave circuits using artificial neural networks: the state-of-the-art," In IEEE Transactions on Microwave Theory and Techniques, vol. 52, No. 1, 16p.

Srinivas, "Genetic Algorithms: A Survey", IEEE Xplore. Downloaded on Feb. 9, 2021. 10 pages.

Storn "Differential evolution—a simple and efficient heuristic for global optimization over continuous spaces," Journal of Global Optimization, vol. 11, No. 4, pp. 341-359, 1997. 19 pages.

Velasco, "Regression and ANN models for electronic circuit design," Complexity, vol. 2018, 2018. 10 pages.

Zhang, "Bayesian Optimization Approach for Analog Circuit Synthesis Using Neural Network," 2019 Design, Automation & Test in Europe Conference & Exhibition (DATE), Florence, Italy, 2019, 6p.

Zhang, "Circuit-GNN: Graph neural networks for distributed circuit design," in International Conference on Machine Learning, pp. 7364-7373, 2019. 10 pages.

Wu et al. "DeepTune: Robust Global Optimization of Electronic Circuit Design Via Neuro-Symbolic Optimization", 2021 IEEE International Symposium on Circuits and Systems (ISCAS), May 2021, 5 pages.

* cited by examiner

200

300

RECEIVE INPUT PARAMETERS 302

A

USE INPUT PARAMETERS BY CIRCUIT SIMULATOR TO GENERATE OUTPUT 304

USE CORRESPONDING INPUT TO AND OUTPUT FROM CIRCUIT SIMULATOR AS INPUT AND OUTPUT PAIRS TO TRAIN NEURAL NETWORK, RESULTING IN TRAINED NEURAL NETWORK (TRAINED MODEL) 306

B

FEEDBACK LOOP

C

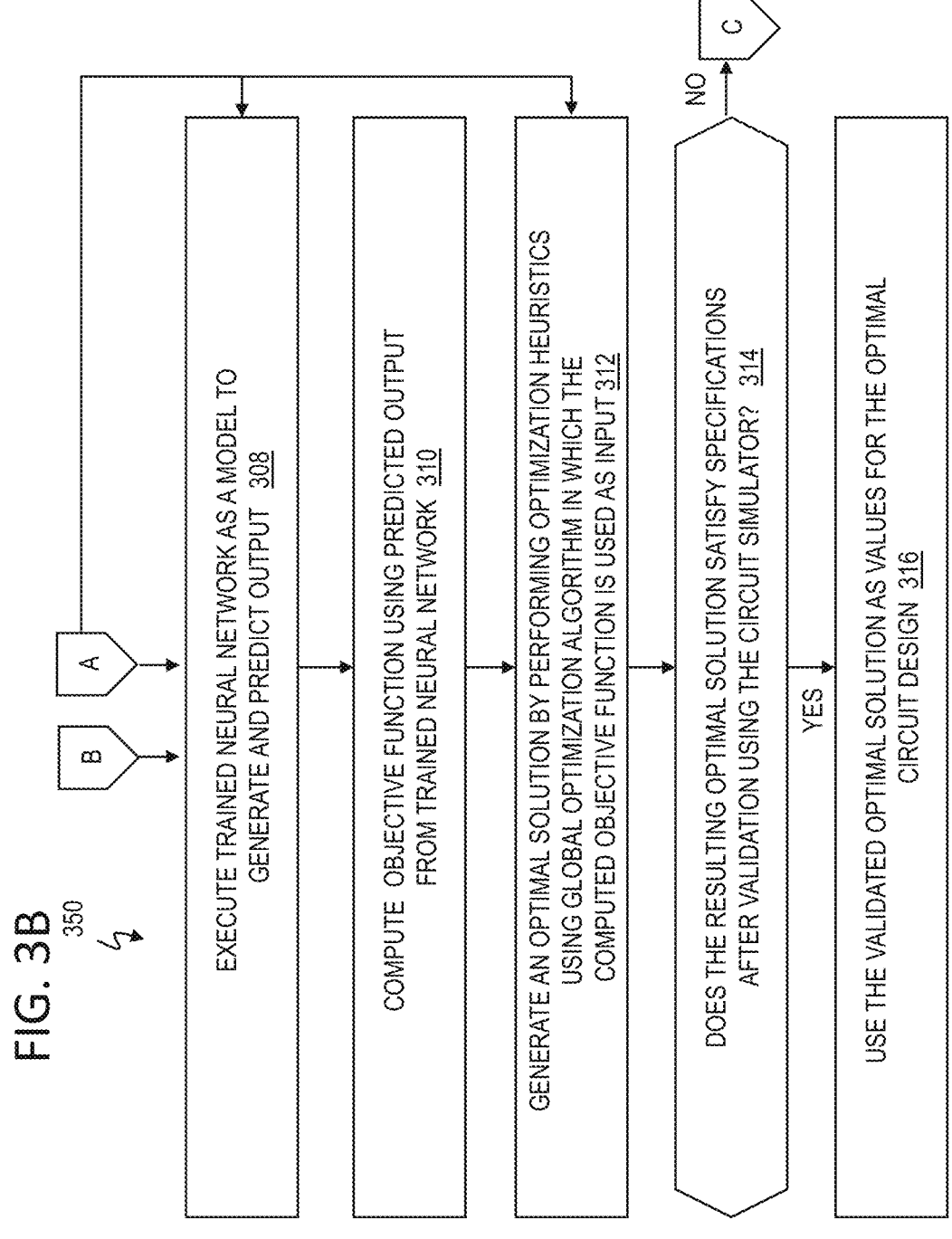

EXECUTE TRAINED NEURAL NETWORK AS A MODEL TO GENERATE AND PREDICT OUTPUT  308

COMPUTE OBJECTIVE FUNCTION USING PREDICTED OUTPUT FROM TRAINED NEURAL NETWORK  310

GENERATE AN OPTIMAL SOLUTION BY PERFORMING OPTIMIZATION HEURISTICS USING GLOBAL OPTIMIZATION ALGORITHM IN WHICH THE COMPUTED OBJECTIVE FUNCTION IS USED AS INPUT 312

DOES THE RESULTING OPTIMAL SOLUTION SATISFY SPECIFICATIONS AFTER VALIDATION USING THE CIRCUIT SIMULATOR?  314

NO

C

YES

USE THE VALIDATED OPTIMAL SOLUTION AS VALUES FOR THE OPTIMAL CIRCUIT DESIGN  316

USE A TRAINED MACHINE LEARNING MODEL TO GENERATE PREDICTED CIRCUIT DATA FOR A CIRCUIT DESIGN  802

COMPUTE AN OBJECTIVE FUNCTION USING THE PREDICTED CIRCUIT DATA  804

PERFORM OPTIMIZATION OF THE OBJECTIVE FUNCTION TO RESULT IN AN OPTIMAL SOLUTION  806

MAP THE OPTIMAL SOLUTION TO THE CIRCUIT DESIGN  808

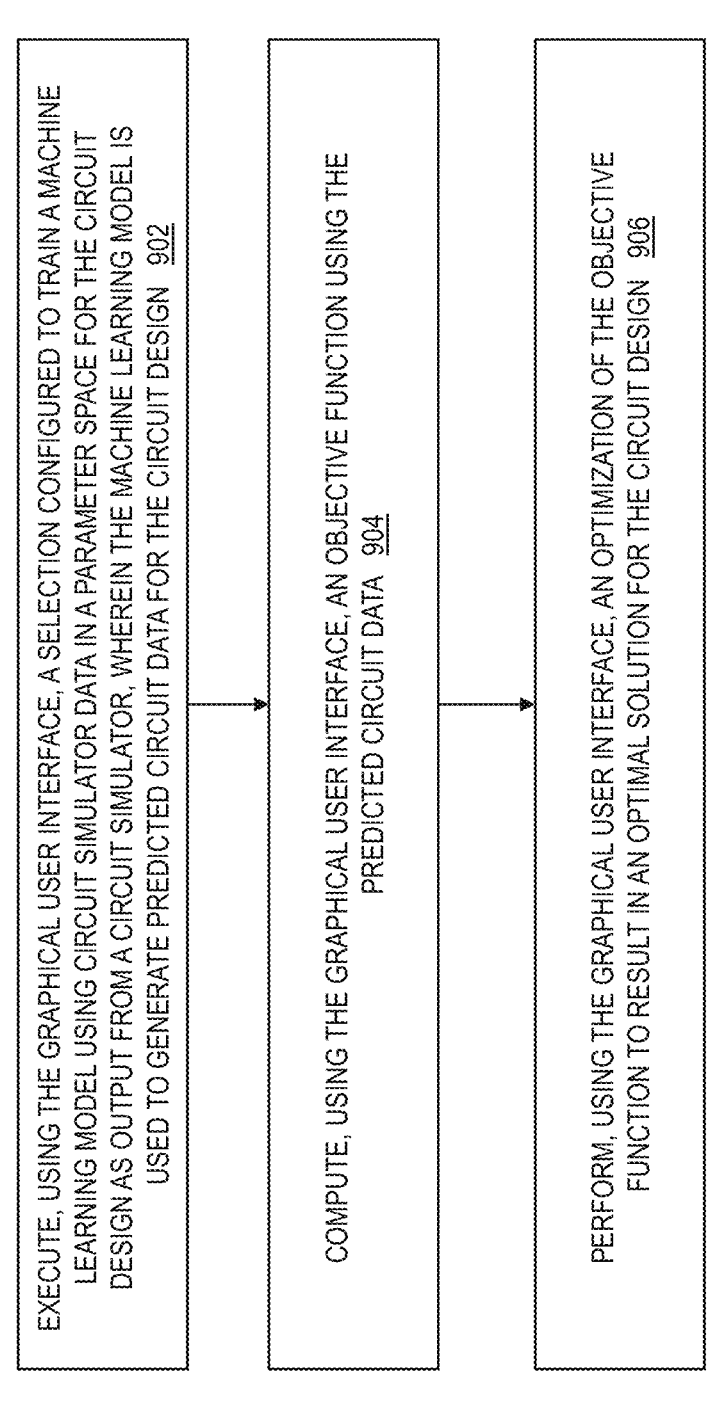

EXECUTE, USING THE GRAPHICAL USER INTERFACE, A SELECTION CONFIGURED TO TRAIN A MACHINE LEARNING MODEL USING CIRCUIT SIMULATOR DATA IN A PARAMETER SPACE FOR THE CIRCUIT DESIGN AS OUTPUT FROM A CIRCUIT SIMULATOR, WHEREIN THE MACHINE LEARNING MODEL IS USED TO GENERATE PREDICTED CIRCUIT DATA FOR THE CIRCUIT DESIGN   902

COMPUTE, USING THE GRAPHICAL USER INTERFACE, AN OBJECTIVE FUNCTION USING THE PREDICTED CIRCUIT DATA   904

PERFORM, USING THE GRAPHICAL USER INTERFACE, AN OPTIMIZATION OF THE OBJECTIVE FUNCTION TO RESULT IN AN OPTIMAL SOLUTION FOR THE CIRCUIT DESIGN   906

FIG. 14
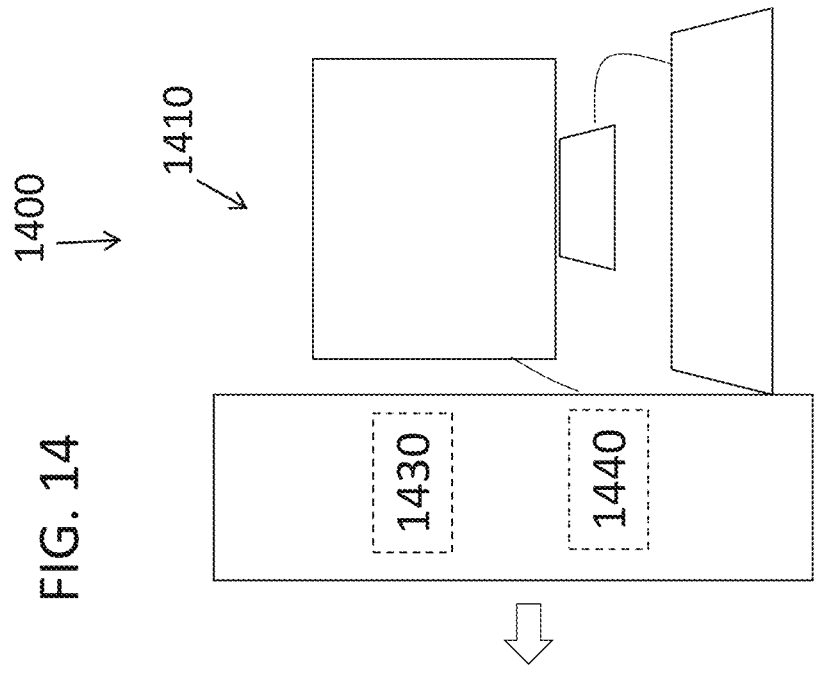
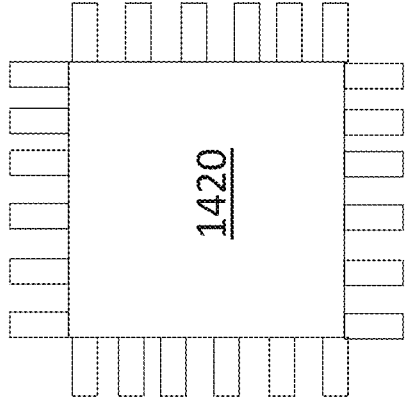

FIG. 15

1510 fabricate masks for lithography 1520 fabricate wafer and dice 1530 test and sort each die

1420

AUTOMATIC ROBUST OPTIMIZATION OF CIRCUITS

BACKGROUND

The present invention generally relates to computer systems, and more specifically, to computer-implemented methods, computer systems, and computer program products configured and arranged for providing automatic robust optimization of circuits.

An integrated circuit or IC chip may include many electronic components that are fabricated by layering several different materials on a silicon base or wafer, thereby forming a semiconductor structure. The design of an integrated circuit transforms a circuit description into a geometric description which is known as a layout. The process of converting the functional specifications of an electronic circuit into a layout is called the physical design. The objective of the physical design is to determine an optimal arrangement of devices in a plane or in a three-dimensional space, and an efficient interconnection or routing scheme between the devices to obtain the desired functionality. An integrated circuit includes elements, and connections between the elements, formed on a surface of a semiconductor substrate. The integrated circuit may include a large number of elements and require complex connections between the elements. Millions of circuits may need to be physically placed and connected on the chip.

Lithography is utilized for the fabrication of semiconductor structures according to the physical design, such as integrated circuits and micromechanical structures. The basic process of producing a semiconductor structure involves the modification of the surface material of a semiconductor substrate, such as of silicon, in a pattern. The interplay of the material changes and the pattern defines the electrical characteristics of the microelectronic device.

In semiconductor manufacturing, a process corner is an example of a design-of-experiments (DoE) technique that refers to a variation of fabrication parameters used in applying an integrated circuit design to a semiconductor wafer. Process corners represent the extremes of these parameter variations within which a circuit that has been etched onto the wafer must function correctly. A circuit running on devices fabricated at these process corners may run slower or faster than specified and at lower or higher temperatures and voltages, but if the circuit does not function at all at any of these process extremes the design is considered to have inadequate design margin. To verify the robustness of an integrated circuit design, semiconductor manufacturers will fabricate corner lots, which are groups of wafers that have had process parameters adjusted according to these extremes, and will then test the devices made from these special wafers at varying increments of environmental conditions, such as voltage, clock frequency, and temperature, applied in combination (two or sometimes all three together) in a process called characterization. The results of these tests are plotted using a graphing technique known as a shmoo plot that indicates the boundary limit beyond which a device begins to fail for a given combination of these environmental conditions. Improved techniques are needed for testing the layout and/or design of integrated circuits under various conditions and process corners.

SUMMARY

Embodiments of the present invention are directed to computer-implemented methods for providing automatic robust optimization of circuits. A non-limiting example computer-implemented method includes using a trained machine learning model to generate predicted circuit data for a circuit design and computing an objective function using the predicted circuit data. Also, the computer-implemented method includes performing optimization of the objective function to generate an optimal solution and mapping the optimal solution to the circuit design.

This provides improvements over known methods for optimizing or tuning circuit designs for circuits by efficiently providing automatic robust optimization and tuning of circuit designs of circuits using the trained machine learning model which is faster than using circuit simulators while using fewer computational resources and allowing for more complicated objective functions.

In addition to one or more of the features described above or below, or as an alternative, further embodiments of the invention include validating the optimal solution using a circuit simulator, responsive to performing optimization of the objective function to generate the optimal solution. This provides improvements over known methods using machine learning because values of the optimal solution that were determined using the trained machine learning model are validated with the circuit simulator as a feedback loop.

In addition to one or more of the features described above or below, or as an alternative, further embodiments of the invention include where the trained machine learning model is a neural network.

In addition to one or more of the features described above or below, or as an alternative, further embodiments of the invention include where the optimization is performed using a genetic algorithm.

In addition to one or more of the features described above or below, or as an alternative, further embodiments of the invention include where the optimization is performed using a swarm optimization algorithm.

In addition to one or more of the features described above or below, or as an alternative, further embodiments of the invention include where the optimization is performed using a Bayes black box optimization algorithm.

In addition to one or more of the features described above or below, or as an alternative, further embodiments of the invention include where the objective function is performed using a Monte Carlo analysis.

In addition to one or more of the features described above or below, or as an alternative, further embodiments of the invention include generating circuit simulator data in a parameter space for the circuit design and training the trained machine learning model using the circuit simulator data.

In addition to one or more of the features described above or below, or as an alternative, further embodiments of the invention include a non-limiting example computer-implemented method for using a graphical user interface for tuning a circuit design. The computer-implemented method includes executing, using the graphical user interface, a selection configured to train a machine learning model using circuit simulator data in a parameter space for the circuit design, the circuit simulator data being from a circuit simulator, where the machine learning model is used to generate predicted circuit data for the circuit design. The computer-implemented method includes computing, using the graphical user interface, an objective function using the predicted circuit data; and performing, using the graphical user interface, an optimization of the objective function to generate an optimal solution for the circuit design.

This provides improvements over known methods by providing a graphical user interface to tune a circuit design using a machine learning model which requires fewer computational resources and is faster than using circuit simulators.

Other embodiments of the present invention implement features of the above-described method in computer systems and computer program products.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 3B is a flowchart of a computer-implemented process for automated robust global optimization of an integrated circuit layout/design by finding optimal design parameters for tuning the integrated circuit using a trained neural network in accordance with one or more embodiments of the present invention;

FIG. 9 is a flowchart of a computer-implemented process for using a graphical user interface for tuning a circuit design to thereby automatically generate an optimal and/or near optimal circuit design that is robust under process corners and operating conditions in accordance with one or more embodiments of the present invention

FIG. 14 is a block diagram of a system to perform automatic robust optimization of circuits in accordance with one or more embodiments of the present invention;

FIG. 15 is a process flow of a method of fabricating the integrated circuit in accordance with one or more embodiments of the present invention;

DETAILED DESCRIPTION

Figure 1:
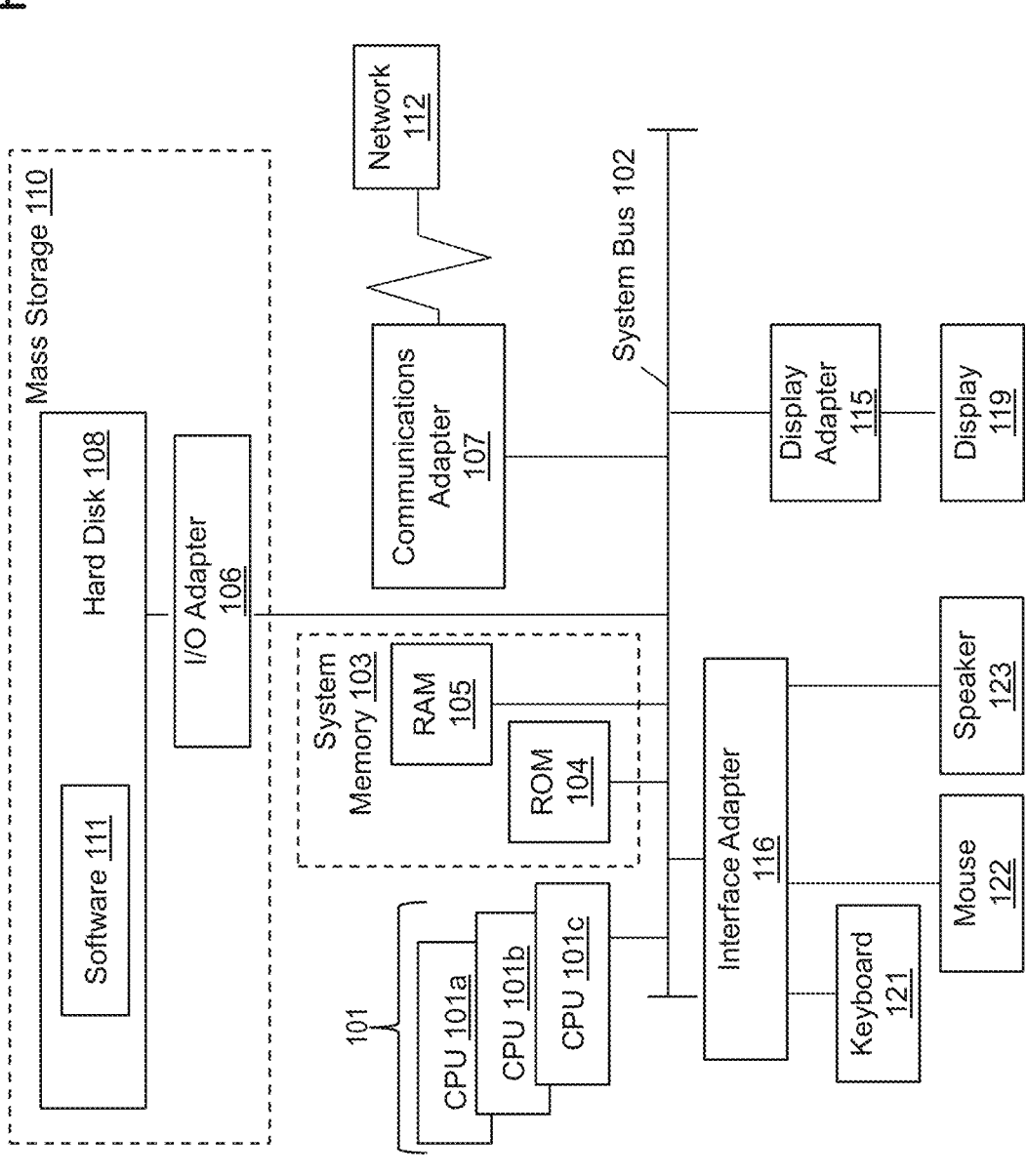
FIG. 1 depicts a block diagram of an example computer system for use in conjunction with one or more embodiments of the present invention.

One or more embodiments of the present invention provide computer-implemented methods, computer systems, and computer program products arranged and configured to provide automatic robust optimization of circuits. One or more embodiments of the present invention utilize machine learning for automated robust optimization of electronic circuit design that combines artificial neural networks and global optimization. A neural network regressor is constructed to predict circuit operation metrics such as power, offset, delay, phase margin, etc., based on input parameters such as device size, temperature, supply voltage, supply current, and process corner. This neural network regressor is then used to build and/or be input to an objective function for global and/or local optimization which finds the optimal and/or near-optimal set of controllable parameters that minimize the objective function subject to input constraints such as device size range and output constraints such as power consumption and stochastic process variations. One or more embodiments of the invention find optimized circuits that outperform circuit designs that were manually tuned by a skilled circuit designer, in much less time.

A time-consuming part of the high-performance circuit design process is to tune the circuit to maximize performance and minimize variability due to process variations. In the state-of-the-art, a circuit is tuned at a typical operating condition and the nominal process corner; the circuit is then checked at the other skewed process corners and a range of operating temperatures and supply voltages to determine whether the design still performs within specifications. If not, the process corners where the circuit failed specifications are identified and the circuit is tuned to fix these corners. This process is reiterated if needed until all corners are within specifications. This greedy approach is suboptimal and can lead to nonconverging iterative cycles. In automatic circuit tuning, the output from the circuit simulation is used to compute an objective function that measures metrics of interest such as power, delay, minimized values, maximized values, etc., using an optimization algorithm. Because the circuit simulation consumes most of the time in the optimization, gradient-based optimization algorithms find a local minimum because finding the global minimum was not practical. Furthermore, to compound the difficulty of the design problem, the circuit needs to be tuned to maximize performance at the nominal corner while not exceeding design constraints under many statistical deviations in process and yield characteristics, operating temperature, and supply voltages. Such minimax problems and stochastic optimization problems are currently not solved in existing tuning methods. Existing methods do not have the ability to generate Pareto-optimal frontiers that show the tradeoff between multiple objectives. Current systems optimize a function that is a weighted sum of objectives with fixed weights chosen by the user. Moreover, the ability to automatically tune circuits, especially robust under process variations, and generate tradeoff curves is currently very limited or nonexistent.

One or more embodiments of the invention are configured to use a neural network as a fast circuit simulator and combine use of the neural network with global optimization heuristics to test and find circuit designs that are robust under process corners. State-of-the-art circuit tuning systems use a circuit simulator to generate performance metrics which is very time consuming. However, systems in one or more embodiments of the invention can test performance metrics many orders of magnitude faster, such as 5, 10, 20, 50, and/or 1,000,000 times faster than the state-of-the-art, while using fewer computational resources including processing power (e.g., fewer processors), memory (e.g., less memory), and bandwidth (e.g., less bandwidth). One or more embodiments of the invention can create Pareto optimal tradeoff curves for multiple objectives. Such capabilities are not available in modern electronic design automation (EDA) tools. As technical advantages and benefits, one or more embodiments of the invention will benefit circuit designers, the electronic design automation (EDA) community, and the semiconductor industry in general as embodiments allows better chips to be designed in less time using less resources (in terms of computation and power) while at the same time freeing the circuit designers from the time-consuming task of circuit tuning and providing them with the tools to explore more fully the space of possible circuits. Further, an improved circuit design of an integrated circuit improves the functioning of a computer itself.

Turning now to FIG. 1, a computer system 100 is generally shown in accordance with one or more embodiments of the invention. The computer system 100 can be an electronic, computer framework comprising and/or employing any number and combination of computing devices and networks utilizing various communication technologies, as described herein. The computer system 100 can be easily scalable, extensible, and modular, with the ability to change to different services or reconfigure some features independently of others. The computer system 100 can be, for example, a server, desktop computer, laptop computer, tablet computer, or smartphone. In some examples, computer system 100 can be a cloud computing node. Computer system 100 can be described in the general context of computer system executable instructions, such as program modules, being executed by a computer system. Generally, program modules can include routines, programs, objects, components, logic, data structures, and so on that perform particular tasks or implement particular abstract data types. Computer system 100 can be practiced in distributed cloud computing environments where tasks are performed by remote processing devices that are linked through a communications network. In a distributed cloud computing environment, program modules can be located in both local and remote computer system storage media including memory storage devices.

As shown in FIG. 1, the computer system 100 has one or more central processing units (CPU(s)) 101*a*, 101*b*, 101*c*, etc., (collectively or generically referred to as processor(s) 101). The processors 101 can be a single-core processor, multi-core processor, computing cluster, or any number of other configurations. The processors 101, also referred to as processing circuits, are coupled via a system bus 102 to a system memory 103 and various other components. The system memory 103 can include a read only memory (ROM) 104 and a random access memory (RAM) 105. The ROM 104 is coupled to the system bus 102 and can include a basic input/output system (BIOS) or its successors like Unified Extensible Firmware Interface (UEFI), which controls certain basic functions of the computer system 100. The RAM is read-write memory coupled to the system bus 102 for use by the processors 101. The system memory 103 provides temporary memory space for operations of said instructions during operation. The system memory 103 can include random access memory (RAM), read only memory, flash memory, or any other suitable memory systems.

The computer system 100 comprises an input/output (I/O) adapter 106 and a communications adapter 107 coupled to the system bus 102. The I/O adapter 106 can be a small computer system interface (SCSI) adapter that communicates with a hard disk 108 and/or any other similar component. The I/O adapter 106 and the hard disk 108 are collectively referred to herein as a mass storage 110.

Software 111 for execution on the computer system 100 can be stored in the mass storage 110. The mass storage 110 is an example of a tangible storage medium readable by the processors 101, where the software 111 is stored as instructions for execution by the processors 101 to cause the computer system 100 to operate, such as is described herein below with respect to the various Figures. Examples of computer program product and the execution of such instruction is discussed herein in more detail. The communications adapter 107 interconnects the system bus 102 with a network 112, which can be an outside network, enabling the computer system 100 to communicate with other such systems. In one embodiment, a portion of the system memory 103 and the mass storage 110 collectively store an operating system, which can be any appropriate operating system to coordinate the functions of the various components shown in FIG. 1.

Additional input/output devices are shown as connected to the system bus 102 via a display adapter 115 and an interface adapter 116. In one embodiment, the adapters 106, 107, 115, and 116 can be connected to one or more I/O buses that are connected to the system bus 102 via an intermediate bus bridge (not shown). A display 119 (e.g., a screen or a display monitor) is connected to the system bus 102 by the display adapter 115, which can include a graphics controller to improve the performance of graphics intensive applications and a video controller. A keyboard 121, a mouse 122, a speaker 123, etc., can be interconnected to the system bus 102 via the interface adapter 116, which can include, for example, a Super I/O chip integrating multiple device adapters into a single integrated circuit. Suitable I/O buses for connecting peripheral devices such as hard disk controllers, network adapters, and graphics adapters typically include common protocols, such as the Peripheral Component Interconnect (PCI) and the Peripheral Component Interconnect Express (PCIe). Thus, as configured in FIG. 1, the computer system 100 includes processing capability in the form of the processors 101, and, storage capability including the system memory 103 and the mass storage 110, input means such as the keyboard 121 and the mouse 122, and output capability including the speaker 123 and the display 119.

In some embodiments, the communications adapter 107 can transmit data using any suitable interface or protocol, such as the internet small computer system interface, among others. The network 112 can be a cellular network, a radio network, a wide area network (WAN), a local area network (LAN), or the Internet, among others. An external computing device can connect to the computer system 100 through the network 112. In some examples, an external computing device can be an external webserver or a cloud computing node.

It is to be understood that the block diagram of FIG. 1 is not intended to indicate that the computer system 100 is to include all of the components shown in FIG. 1. Rather, the computer system 100 can include any appropriate fewer or additional components not illustrated in FIG. 1 (e.g., additional memory components, embedded controllers, modules, additional network interfaces, etc.). Further, the embodiments described herein with respect to computer system 100 can be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

Figure 2:
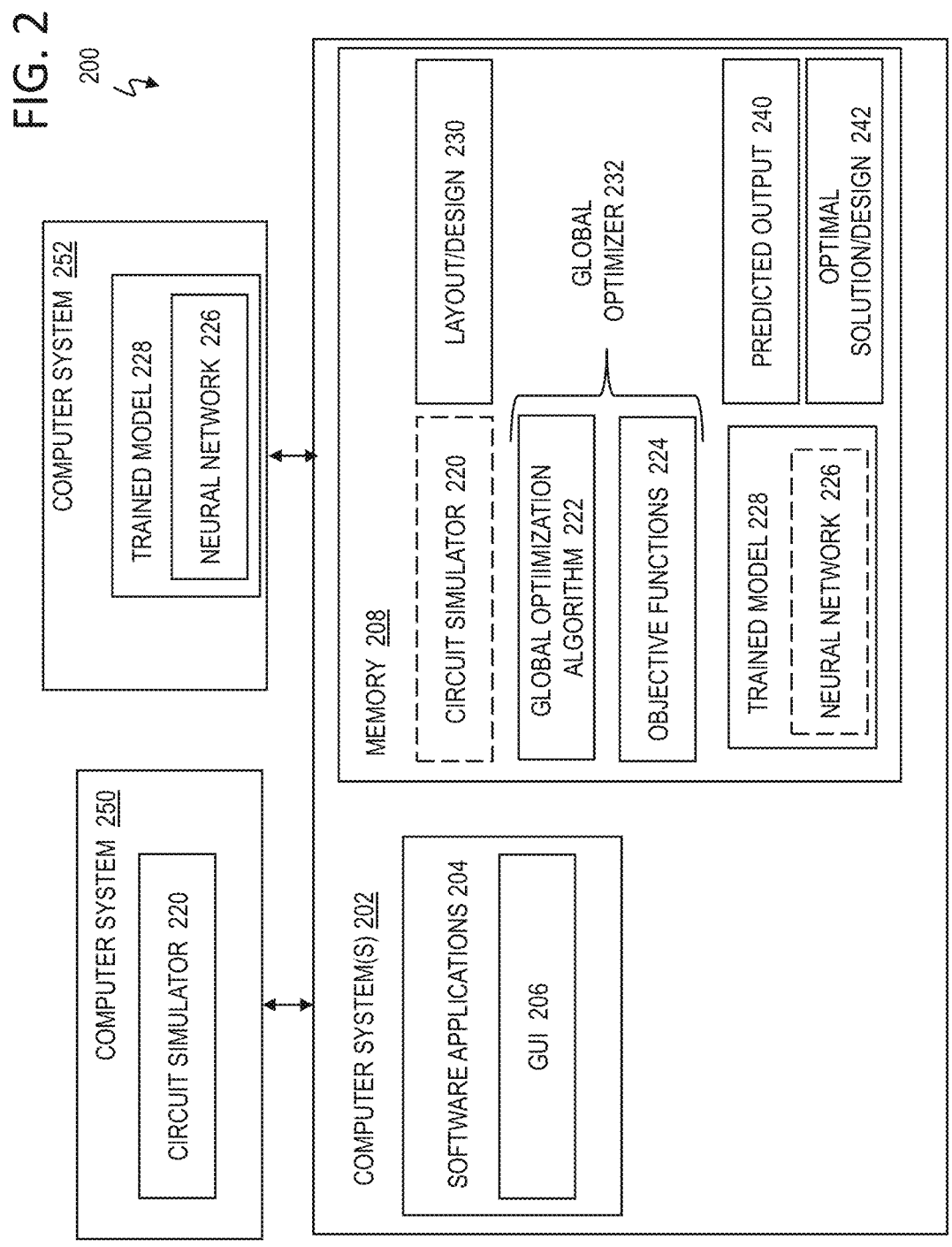
FIG. 2 depicts a block diagram of a system for providing automatic robust optimization of circuits in accordance with one or more embodiments of the present invention.

FIG. 2 is a block diagram of a system 200 for providing automatic robust optimization of circuits in accordance with one or more embodiments of the present invention. System 200 includes one or more computer systems 202 connected to computer systems 250 and 252. In one or more embodiments, computer system 202 can include and/or integrate functionality and aspects of computer system 250 and/or computer system 252, although FIG. 2 depicts computer system 202 are being separate from computer systems 250 and 252. For example, circuit simulator 220 of computer system 250 and/or neural network 226 of computer system 252 may be implemented in computer system 202 in one or more embodiments.

Software applications 204, graphical user interface (GUI) 206, circuit simulator 220, global optimization algorithm 222, objection functions 224, neural network 226, trained model 228, and layout/design 230 can be implemented as software 111 executed on one or more processors 101, as discussed in FIG. 1. Elements of computer system 100 can be used in and/or integrated into computer system 202, computer system 250, and computer system 252 in accordance with one or more embodiments of the invention.

The layout/design 230 of an integrated circuit is to be optimized according to one or more embodiments of the invention. The system 200 is utilized as a circuit optimization framework which utilizes deep learning, robust global optimization, and reinforcement learning. Using deep learning, the space covering the input parameters (I) is sampled and the circuit simulated on the circuit simulator 220 producing input-output pairs (x, y). The set of input-output pairs are split into a training set and a testing set. The neural network 226 is trained using the training set and its performance evaluated using the testing set.

Using robust global optimization, an objective function 224 that incorporates all the input and output parameters is defined. A global optimization algorithm 222 is used to find the set of design parameters as an optimal solution/design 242 for the circuit layout/design 230. The global optimization heuristics of global optimization algorithm 222 can be implemented in various ways according to what circuit element or elements are being optimized in the circuit layout/design 230. As some examples, the global optimization heuristics that can be utilized may include genetic algorithms, differential evolution, simulated annealing, swarm optimization, and other known methods.

Using reinforcement learning, the optimal solution from the global optimization algorithm 222 is validated with the high precision circuit simulator 220 and the simulation results are fed back to improve the training of the neural network 226. A small testing error gives confidence that the optimal solution from global optimizer 232 (implemented using objective function 224 and global optimization algorithm 222) has an objective function value (i.e., optimal solution/design 242) close to the optimal value of the objective function when simulated on a circuit simulator 220. Furthermore, the optimal parameters (optimal solution/design 242) generated by the global optimizer 232 can be used as a starting point for further tuning using the circuit simulator 220 if desired.

Figure 3A:
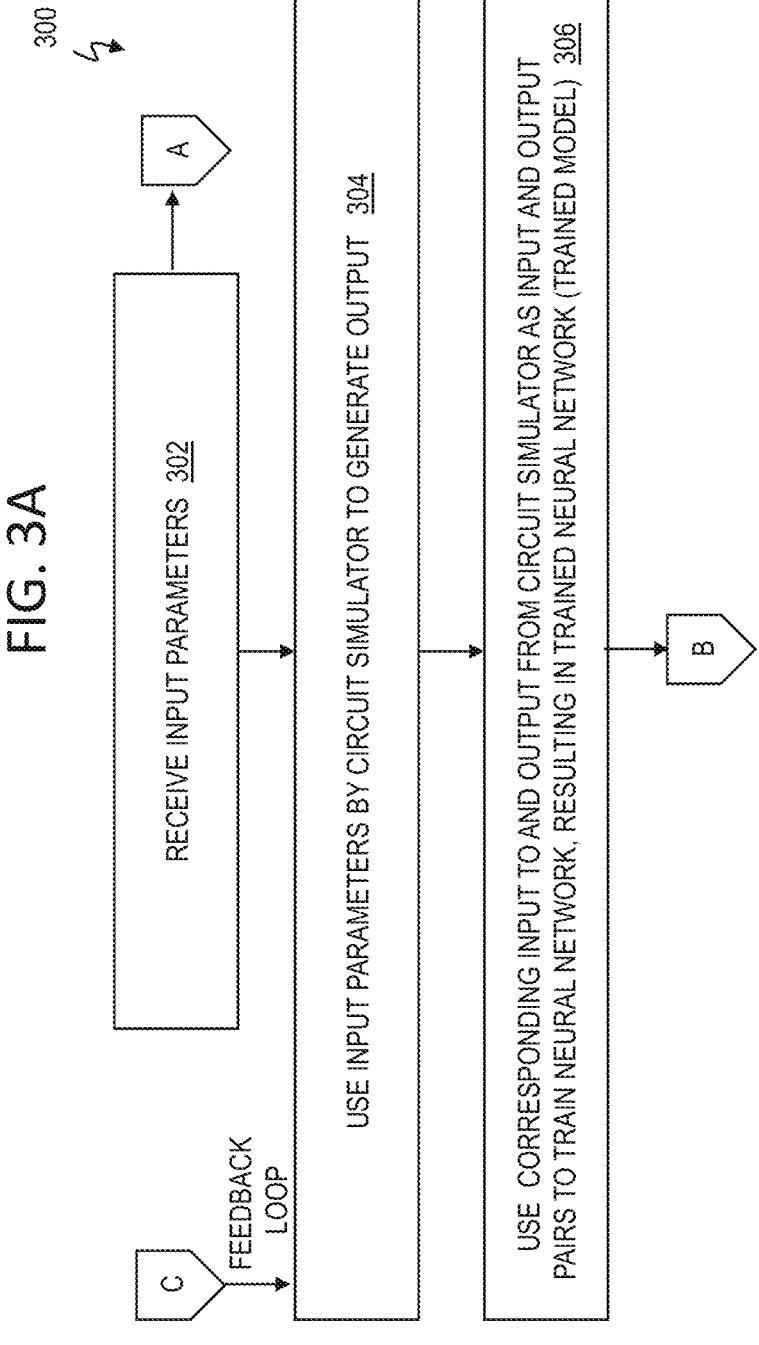
FIG. 3A is a flowchart of a computer-implemented process for training a neural network in accordance with one or more embodiments of the present invention.
Figure 4:
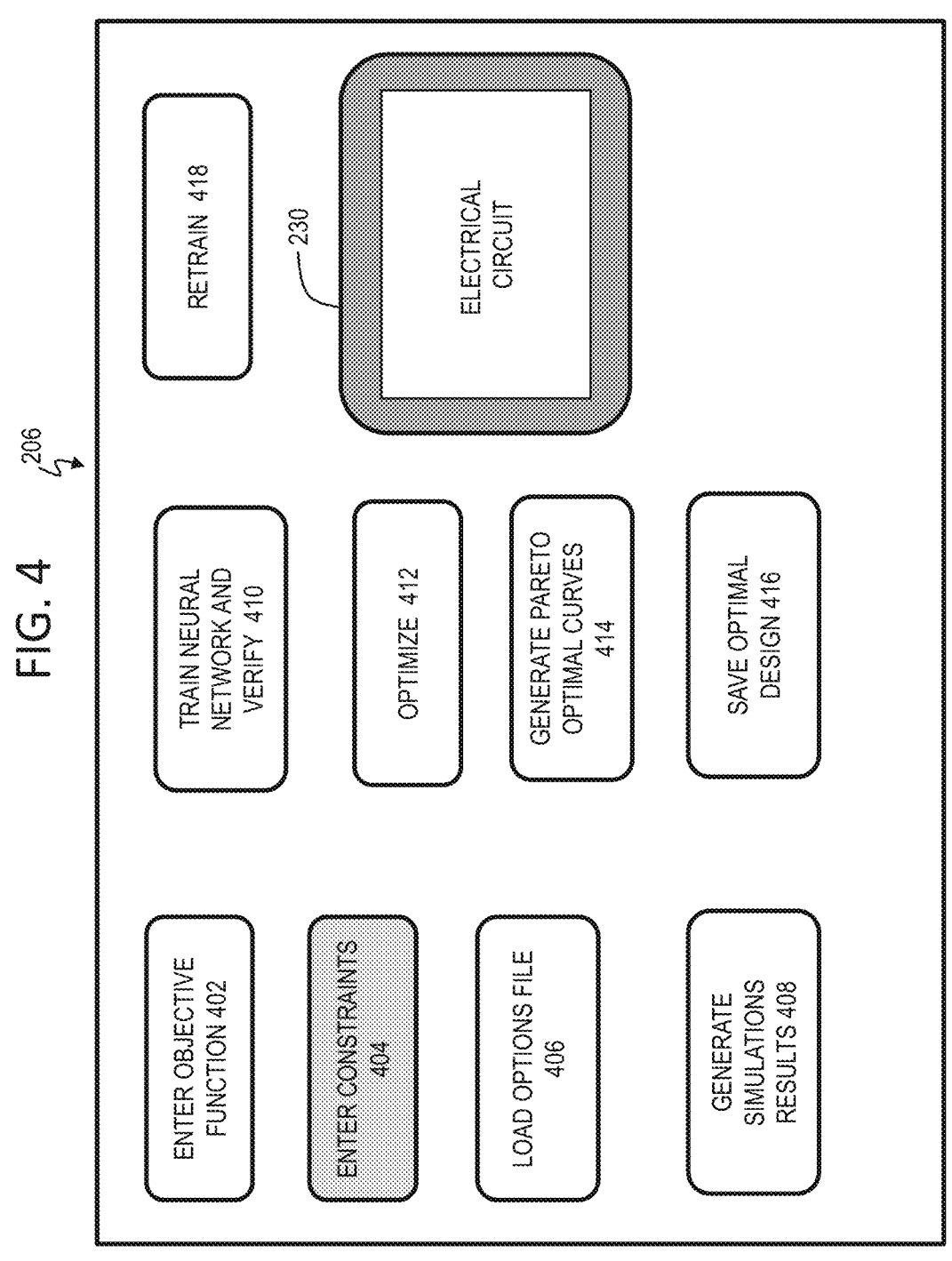
FIG. 4 depicts an example selection in a graphical user interface in accordance with one or more embodiments of the present invention.
Figure 5:
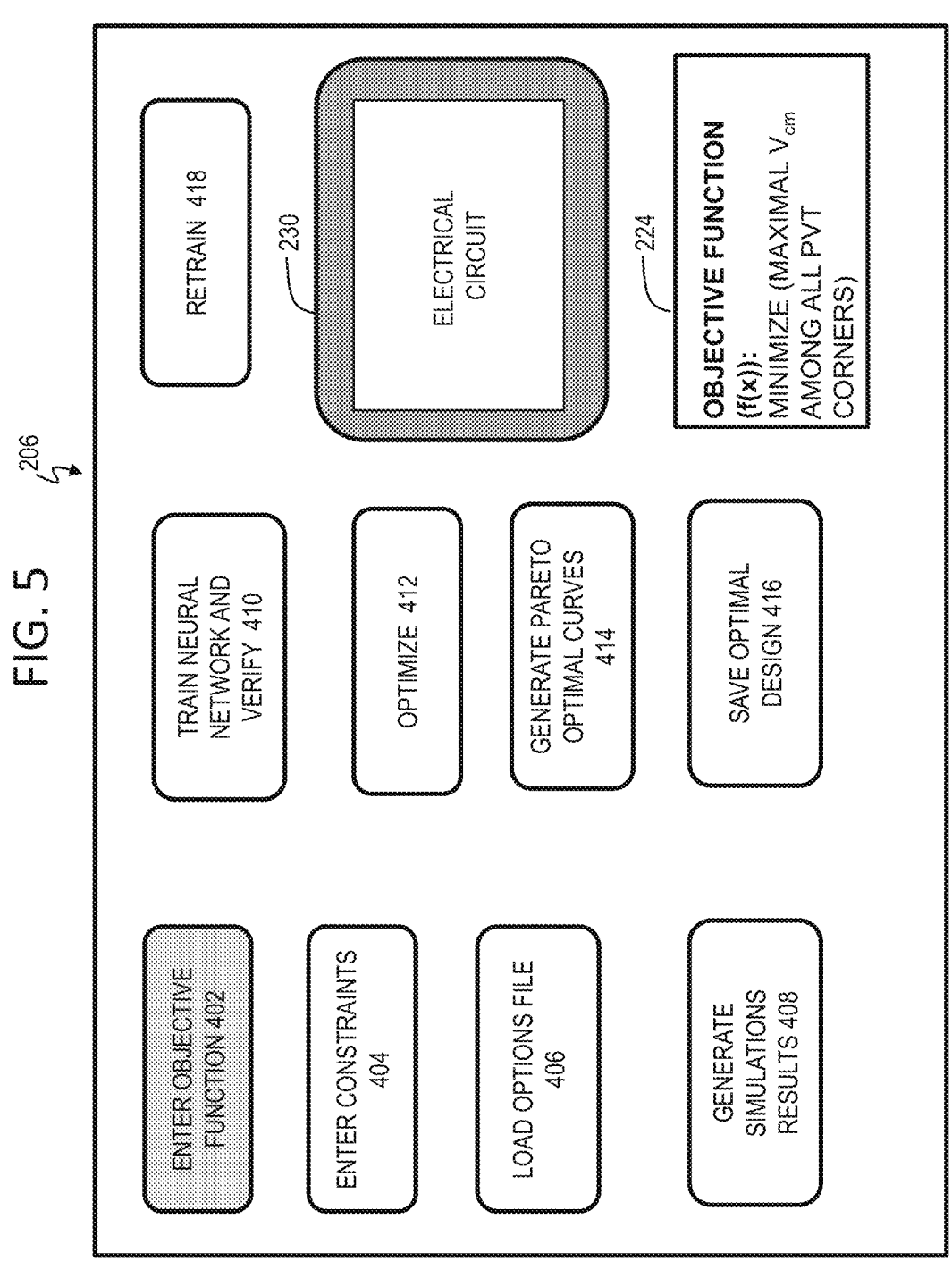
FIG. 5 depicts an example selection in the graphical user interface in accordance with one or more embodiments of the present invention.
Figure 6:
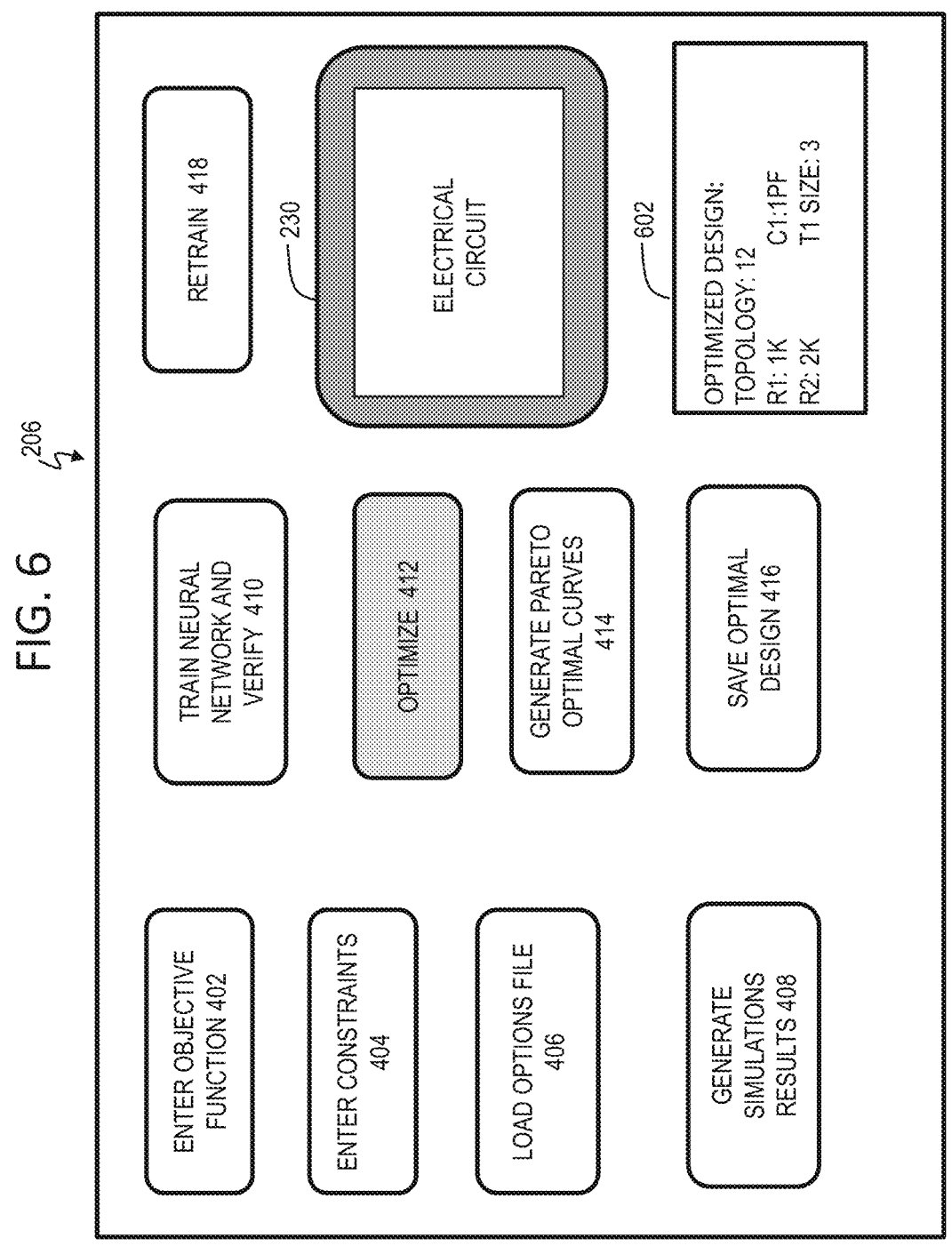
FIG. 6 depicts an example selection in the graphical user interface in accordance with one or more embodiments of the present invention.

FIG. 3A is a flowchart of a computer-implemented process 300 illustrating training the neural network 226 to generate a trained model 228, and FIG. 3B is a flowchart of a computer-implemented process 350 illustrating automated robust global optimization of integrated circuit layout/design 230 by finding optimal design parameters (optimal solution/design 242) for tuning the integrated circuit using the trained neural network 226 as trained model 228 according to one or more embodiments of the invention. The integrated circuit is represented by circuit layout/design 230. The computer-implemented process 300 in FIG. 3A and computer-implemented process 350 in FIG. 3B can be implemented using system 200 shown in FIG. 2, along with FIGS. 1 and 4-17. Accordingly, the computer-implemented processes 300 and 350 will now be described with reference to system 200.

At block 302, software applications 204 of computer system 202 are configured to receive input parameters (I) for running/simulating execution of the layout/design 230 for the integrated circuit by circuit simulator 220. The input parameters (I) include process/environment parameters ($I_p$) including process variation, supply voltage, and operating temperature (PVT) corners as well as design parameters ($I_d$) for circuit elements in the layout/design 230. FIGS. 4, 5, 6, and 7 depict examples of graphical user interface (GUI) 206 which can be integrated with software applications 204 in accordance with one or more embodiments. The GUI 206 can be displayed on a display such as display 119 for use by the user (e.g., system designer/operator). GUI 206 can include buttons 402, 404, 406, 408, 410, 412, 414, 416, and 418 executed by software applications 204. Selection of any of the buttons can display additional input screens to facilitate functionality discussed herein. Any type of input interface, for example via the interface adapter 116, can be used to select buttons, as well as input or enter files, data, commands, etc., by the user. Enter constraints button 404 of GUI 206 can be utilized to input the input parameters (I) via software applications 204. In one or more embodiments, buttons of GUI 206 can be selected in advance and the system 200 automatically performs automatic robust optimization of the circuit layout/design 230 with little and/or no further input from the operator. In one or more embodiments, buttons of GUI 206 can be selected in advance and/or at various stages of the automatic robust optimization of the circuit layout/design 230. Regardless, use and discussion of GUI 206 is not meant to be limited and can occur at any desired stage of automatic robust optimization of the circuit layout/design 230.

At block 304, software applications 204 of computer system 202 are configured to generate output (e.g., circuit simulator data) by performing circuit simulation of layout/design 230 of using circuit simulator 220 with input parameters (I). In one or more embodiments, the generate simulations results button 408 may be utilized which causes software applications 204 to start the circuit simulation using circuit simulator 220. The circuit simulator 220 is automatically run numerous times (e.g., as set in advance) to obtain the set of input (input parameters) and output pairs which are used as training data for training the neural network 226 and later for performance evaluation (as testing data) of the trained neural network 226. Software applications 204 can call and/or initiate the circuit simulator 220. Circuit simulator 220 can be one the electronic design automation (EDA) tools. Circuit simulation is a technique where computer software simulates the behavior of an electronic circuit or system. Example circuit simulators can include SPICE, SPECTRE, etc.

At block 306, software applications 204 of computer system 202 are configured to train neural network 226 using input and output pairs of the circuit simulator data thereby resulting in trained model 228. The trained neural network 226 becomes and is used as the trained model 228 which can act as a proxy for circuit simulator 220 as discussed further herein. Trained neural network 226 and trained model 228 may be used interchangeably. In one or more embodiments of the invention, neural networks can use a resistive switching device (RSD) (which could be a software component in some implementations) as a connection (synapse) between a pre-neuron and a post-neuron, thus representing the connection weight in the form of device resistance. Neuromorphic systems are interconnected processor elements that act as simulated "neurons" and exchange "messages" between each other in the form of electronic signals. Similar to the so-called "plasticity" of synaptic neurotransmitter connections that carry messages between biological neurons, the connections in neuromorphic systems such as neural networks carry electronic messages between simulated neurons, which are provided with numeric weights that correspond to the strength or weakness of a given connection. The weights can be adjusted and tuned based on experience, making neuromorphic systems adaptive to inputs and capable of learning. For example, a neuromorphic/neural network for handwriting recognition is defined by a set of input neurons, which can be activated by the pixels of an input image. After being weighted and transformed by a function determined by the network's designer, the activations of these input neurons are then passed to other downstream neurons, which are often referred to as "hidden" neurons. This process is repeated until an output neuron is activated. Thus, the activated output neuron determines (or "learns") which character was read. Multiple pre-neurons and post-neurons can be connected through an array of RSD, which naturally expresses a fully-connected neural network.

Referring to FIG. 3B, at block 308 of process 350, software applications 204 of computer system 202 are configured to receive input parameters (I) for running/simulating execution of the layout/design 230 for the integrated circuit using the trained neural network 226 as trained model 228, which results in predicted output 240. In one or more embodiments, the trained neural network 226 and verify button 410 in GUI 206 may be selected to generate the predicted output 240 in inference mode and/or GUI 206 could optionally include a separate button to execute the trained neural network 226 in inference. GUI 206 can provide an option for training mode and inference mode. As noted above, the input parameters (I) include process/environment parameters (I$_p$) including process variation, supply voltage, and operating temperature (PVT) corners as well as design parameters (I$_d$) for circuit elements in the layout/design 230. The input parameters used by trained model 228 are varied to determine operating results of layout/design 230 at various extremes and/or process corners for the input parameters, which results in input and output pairs (x, y) as the predicted output 240. The predicted output 240 includes the output of the trained neural network 226, and the software applications 204 can match the corresponding input parameters to the predicted output 240, thereby resulting in input and output pairs that can be generally recognized as the predicted output 240. The predicted output 240 can be for specific circuit elements in layout/design 230, such as circuit elements R1 (resistor 1), R2 (resistor 2), C1 (capacitor 1), and T1 (transistor 1).

At block 310, software applications 204 of computer system 202 are configured to use these predicted input and output pairs (e.g., predicted output) generated by trained model 228 to compute the objective function 224 (e.g., objective function f(x)). In one or more embodiments, there can be many objective functions 224 to select from depending on the desired optimization functions needed for the circuit design. In the GUI 206 of FIG. 5, the enter objective function button 402 may be initiated to enter the desired objective function 224 and/or select the objective function 224 from a list of different objective functions. The objective function 224 is computed for all the desired input parameters using the predicted output 240 from the trained neural network 226. An example objective function may include the maximum phase margin among all process corners and operating conditions, given a set of design parameters. Another example function is the weighted sum of power consumption among all process corners and operating conditions, given a set of design parameters. For example, the objection function 224 can be computed for circuit elements R1, R2, C1, and T1 in layout/design 230.

At block 312, software applications 204 of computer system 202 are configured to generate an optimal solution/design 242 by performing optimization heuristics using the global optimization algorithm 222 in which the computed objective function 224 is used as input. An example global optimization algorithm 222 can be a minimax problem that is computed using the objective function 224 (e.g., objective function f(x)). Accordingly, the global optimization algorithm 222 is configured to find the minimax of f(x) for the various values of the predicted output (x, y) from the trained neural network 226. Blocks 310 and 312 work together and perform the function of the global optimizer 232. In one or more embodiments, blocks 310 and 312 may be performed simultaneously and/or nearly simultaneously. In one or more embodiments, in the GUI 206 of FIG. 6, the optimize button 412 can be selected to initiate the global optimization by the global optimizer 232. The layout/design 230 of the integrated circuit can be optimized for circuit elements R1, R2, C1, and T1. The predicted output 240 from neural network 226, the objective function 224, and the global optimization algorithm 222 relate to predetermined circuit elements (e.g., R1, R2, C1, and T1) in layout/design 230. Given a first set for values of circuit element parameters (e.g. R1, R2, C1 and T1) along with other values such as temperature, operating, and process corner parameters, the neural network predicts and generates the circuit performance parameters which are then used to compute the objective function value. This computation of objective function 224 is repeated for other sets of values of circuit elements parameters. Lastly, the objective function values are used by the global optimization algorithms 222 to find the set of circuit element parameters that optimizes the objective function 224. The output of the global optimization algorithm 222 is then the optimal values for R1, R2, C1, and T1 as the optimal solution. Software applications 204 of computer system 202 are configured to map the optimal solution back to the circuit elements of interest. For example, the optimal solution/design 242 is a candidate set of design parameters ($I_d$), such as values for circuit elements (e.g., R1, R2, C1, and T1), which make the layout/design 230 perform optimally over the desired operating conditions and PVT corners.

Figure 7:
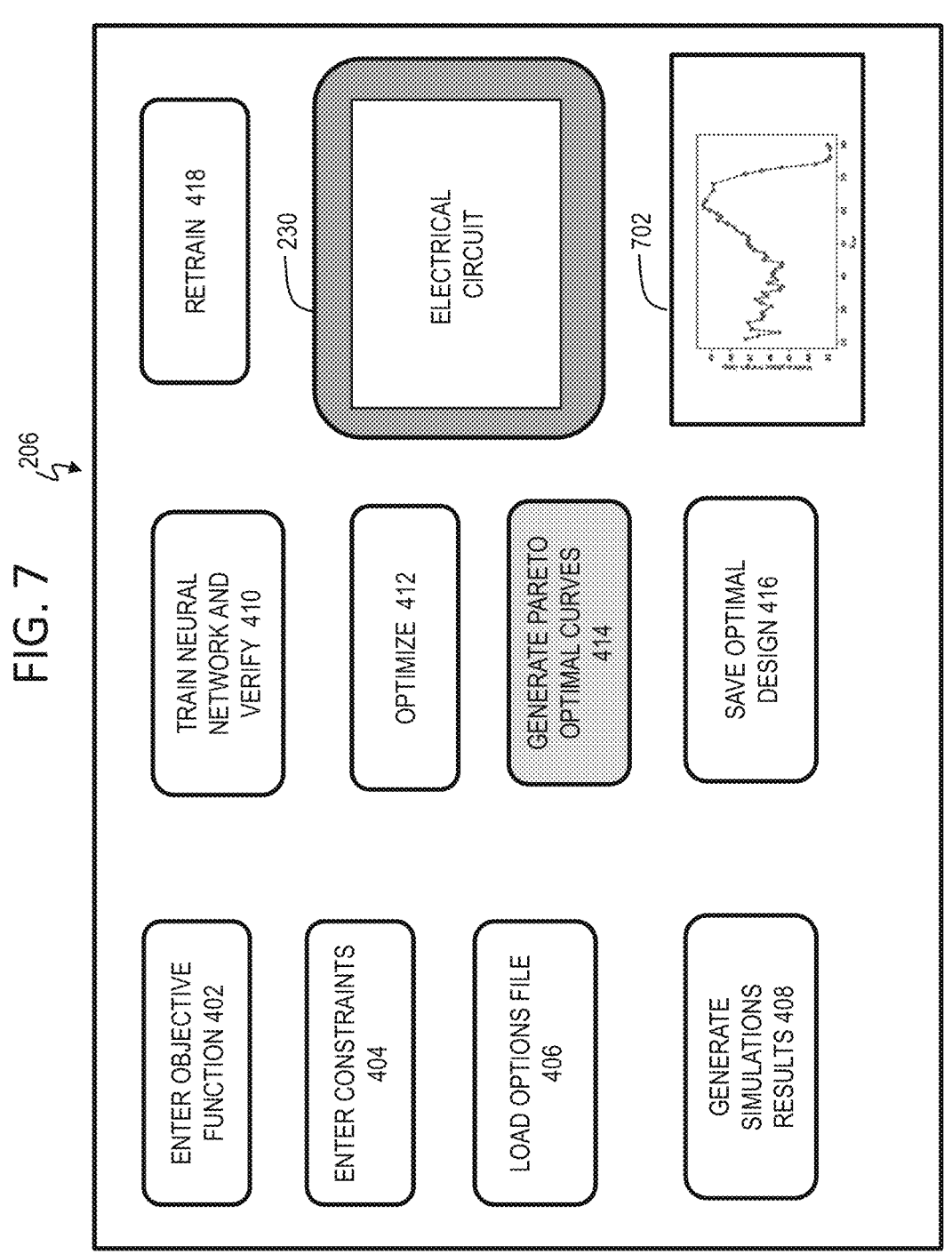
FIG. 7 depicts an example selection in the graphical user interface in accordance with one or more embodiments of the present invention.

Because the predicted output was determined using the faster trained neural network 226 instead of the slower circuit simulator 220, the software applications 204 of computer system 202 are configured to validate that the optimal solution/design 242 (e.g., values for circuit elements R1, R2, C1, and T1) is correct by using the circuit simulator 220 at block 314. The validation performs a feedback of the values of the optimal solution (e.g., values for circuit elements R1, R2, C1, and T1 in layout/design 230) to the circuit simulator 220 for confirmation by the circuit simulator 220 that the optimal solution, and likewise, the simulation results of the circuit simulator 220 are fed back to the neural network 226 to improve training. The software applications 204 cause the circuit simulator 220 to execute with, for example, values for circuit elements R1, R2, C1, and T1 to determine whether the layout/circuit 220 operates within guidelines and specifications. Some example specifications could be that the output parameters of interest of the neural network 226 and the circuit simulator 220 match within a predefined percentage difference. Another example specification could be that the output parameters of the circuit simulator 220 are within the desired range. If ("No") the values of the optimal solution are not valid, the neural network 226 is improved by further training. If ("Yes") the values of the optimal solution are valid, the software applications 204 of computer system 202 are configured to use/insert the values of the validated optimal solution/design 242 as the values for circuit elements (e.g., R1, R2, C1, and T1) in the optimal circuit design (i.e., in layout/design 230) at block 316. Therefore, the circuit layout/design 230 is optimized and improved to include the validated optimal solution/design 242 and is consequently tuned according to the specified input parameters. In one or more embodiments, the optimize button 412 in GUI 206 of FIG. 6 can be selected to generate the optimal solution, which illustrates optimized design 602 as values for the optimal solution to be used in the layout/design 230. FIG. 7 depicts an example GUI 206 illustrating selection of the generate Pareto optimal curves button 414 which results in a Pareto optimal curve 702 for one objective function value (e.g., capacitor size of a circuit element) on the x-axis versus another objective function value (e.g. phase margin) on the y-axis.

Technical benefits and advantages include a robust global optimization of an electronic circuit design using a neural network according to one or more embodiments of the invention. As discussed herein, the neural network is utilized as a fast circuit simulator and combined with global optimization heuristics to test and find circuit designs that are robust under process corners and operating conditions. Systems and techniques in one or more embodiments of the invention can test performance metrics many orders of magnitude faster than using a circuit simulator alone. As further technical advantages and benefits, one or more embodiments of the invention allow for better chips to be designed in less time using less resources (in terms of computation and power).

Figure 8:
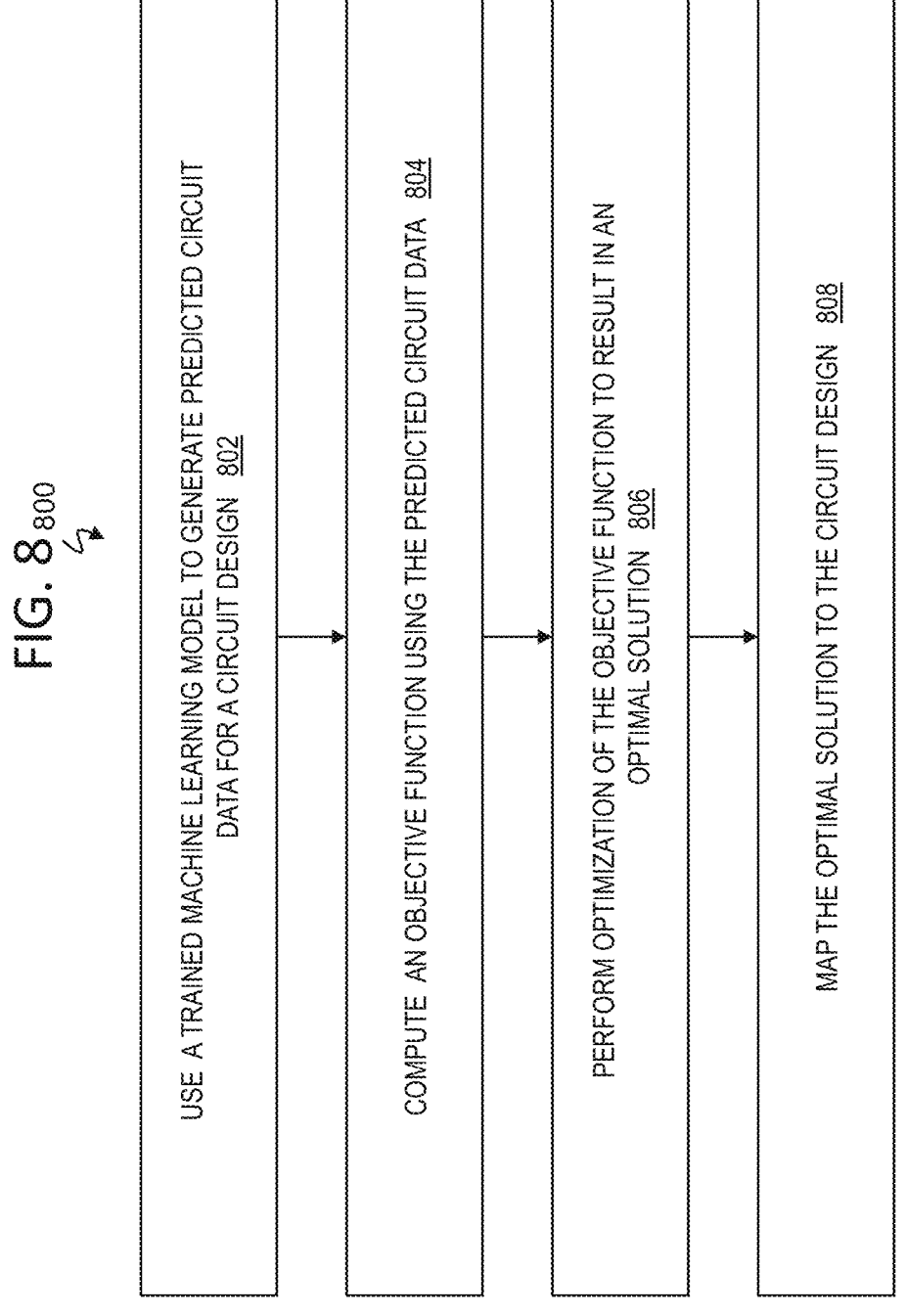
FIG. 8 is a flowchart of a computer-implemented process for automatically generating an optimal and/or near optimal circuit design that is robust under process corners and operating conditions in accordance with one or more embodiments of the present invention.

FIG. 8 is a flowchart of a computer-implemented process 800 for automatically generating an optimal and/or near optimal circuit design that is robust under process corners and operating conditions in accordance with one or more embodiments of the present invention. The computer-implemented process 800 in FIG. 8 can be implemented using system 200 shown in FIG. 2. At block 802, software applications 204 on computer system 202 are configured to use a trained machine learning model (e.g., trained model 228) to generate predicted circuit data (e.g., predicted output 240) for a circuit design (e.g., layout/design 230). At block 804, software applications 204 on computer system 202 are configured to compute an objective function 224 using the predicted circuit data (e.g., predicted output 240). At block 806, software applications 204 on computer system 202 are configured to perform an optimization (e.g., via global optimization algorithm 222) of the objective function 224 to generate an optimal solution (e.g., optimal solution/design for the layout/design 230). At block 808, software applications 204 on computer system 202 are configured to map the optimal solution to the circuit design (e.g., layout/design 230), thereby implementing the values of the optimal solution (e.g., optimal solution/design into the layout/design 230) to create an improved and tuned circuit design (e.g., layout/design 230).

Further, software applications 204 on computer system 202 are configured to validate the optimal solution (e.g., the values of the optimal solution/design in layout/design 230) using a circuit simulator 220, responsive to performing optimization of the objective function 224 to generate the optimal solution. The trained machine learning model (e.g., trained model 228) is a neural network 226. The optimization is performed using a global optimization algorithm (e.g. a genetic algorithm, a swarm optimization algorithm, or a Bayes black box optimization algorithm). The objective function 224 is computed using, for example, a Monte Carlo analysis. The objective function 224 is computed as the worst-case solution among processor corners and operating conditions. Software applications 204 on computer system 202 are configured to cause and/or invoke the circuit simulator 220 to generate circuit simulator data in a parameter space for the circuit design, and configured to train the machine learning model (e.g., trained model 228) using the circuit simulator data.

FIG. 9 is a flowchart of a computer-implemented process 900 for using/configuring a graphical user interface 206 for tuning a circuit design (e.g., layout/design 230) to thereby automatically generate an optimal and/or near optimal circuit design that is robust under process corners and operating conditions in accordance with one or more embodiments of the present invention. The computer-implemented process 900 in FIG. 9 can be implemented using system 200 shown in FIG. 2.

At block 902, software applications 204 on computer system 202 are configured to execute, using the graphical user interface 206, a selection (e.g., using train neural network and verify button 410) configured to train a machine learning model (e.g., neural network 226) using circuit simulator data in a parameter space for the circuit design. The circuit simulator data (e.g., training data and testing data) is output from a circuit simulator 220 (e.g., the training data and testing data can be uploaded via the load options file button 406), wherein the machine learning model (e.g., neural network 226) is used to generate predicted circuit data (e.g., predicted output 240) for the circuit design (e.g., layout/design 230) as a proxy for the circuit simulator 220. At block 904, software applications 204 on computer system 202 are configured to compute, using the graphical user interface 206, an objective function 224 using the predicted circuit data (e.g., predicted output 240). The objective function 224 can be entered and/or uploaded via software applications 204 using the enter objective function button 402 and/or the load options file button 406, such that one or more display screens can be presented to facilitate the entering/uploading of the same.

At block 906, software applications 204 on computer system 202 are configured to perform, using the graphical user interface 206, an optimization (e.g., via global optimization algorithm 222) of the objective function 224 to generate an optimal solution (e.g., optimal solution/design 242) for the circuit design (e.g., layout/design 230), thereby implementing the values of the optimal solution (e.g., optimal solution/design for the layout/design 230) to create an improved and tuned circuit design (e.g., layout/design 230). In one or more embodiments, the optimize button 412 can be utilized to initiate computation of the objective function 224 and/or optimization of the objective function 224 using the global optimization algorithm 222. Any of the buttons in GUI 206 can be selected in advance such that tuning layout/design 230 automatically generates the optimal and/or near optimal circuit design that is robust under process corners and operating conditions.

For explanation purposes and not limitation, examples are discussed below, and section headings are used to ease understanding.

I. Artificial Neural Network as a Fast Approximate Circuit Simulator

The artificial neural network is used as an approximate but extremely fast simulator of the circuit under consideration in order to quickly explore the parameter space. First, we decide on the input parameter set I. This set of parameters $I = I_d \cup I_p$ is decomposed into two groups $I_d$ and $I_p$. The design (or controllable) parameters $I_d$ are system parameters that the circuit designer can change (and can be continuous or discrete variables) such as device size, circuit topology, and resistor values. Circuit topology can be expressed via the set of circuit elements that have nonzero resistances or capacitances. $I_p$ are the process, yield, and environmental parameters such as operating temperature, process corner, supply voltage variations, and other operating conditions. The output parameters O are the performance parameters such as power consumption, timing offset, group delay, and area. For each $p \in I$ and $q \in O$, there is denoted $X_p$ and $Y_q$ as the set where the parameters p and q can take values in respectively.

As noted herein, the circuit optimization framework is a neuro-symbolic optimization framework where the space covering the input parameters I is sampled and the circuit simulated on a circuit simulator producing input-output pairs $(x_i, y_i)$ with $x_i \in \times_{p \in I} X_p$ and $y_i \in \times_{q \in O}$ $$Y_q^2,$$

where $\times X_p$ is to denote the n-fold Cartesian product. A naive algorithm can sample each parameter in I independently from a uniform or Gaussian distribution, but algorithms such as adaptive sampling or Latin hypercube sampling can be used to ensure the parameter space is sufficiently well explored and avoid the clustering problems with independent sampling. The set of input-output pairs $(x_i, y_i)$ are split into a training set and a testing set.

II. Optimization of a Phase-Locked Loop (PLL) Circuit

To illustrate the applicability of this approach, the tuning of a differential charge pump is considered for a state-of-the-art high-performance phase-locked loop (PLL) circuit currently used in high performance central processing units (CPUs) in industry. The tuning of this circuit (e.g., layout/design 230) is currently performed by experienced circuit designers who, based on their experience, preset certain device sizes for symmetry and for mirrored currents. They also take into account physical design constraints and power constraints to determine device sizes. The circuit was tuned in direct current (DC) analysis to find steady-state solutions and measure design margins at a typical usage and nominal corner. Then the same circuit is simulated to check design margins across process variation, supply voltage, and operating temperature (PVT) corners. The circuit was simulated many times through many iterations. The simulation measurements were monitored to determine which design parameters can be changed that resulted in better design margins. For this particular circuit, the hardest specification to meet while tuning is the common mode offset voltage $$V_{cm}^{off},$$

which are the input offset of the common mode feedback amplifier. Often, when one selects devices to reduce this offset at a nominal corner, it results in a larger offset at other skewed process corners. Even sweeping only a few device parameters at a time, the resulting search space can still be very large. Such tuning can take several days, even though each DC simulation takes only a few minutes.

According to one or more embodiments of the invention, the example approach is to automatically tune this circuit (e.g., layout/design 230) by finding a set of design parameters that minimize the common mode offset voltage across multiple PVT corners. First, a set is picked of 8 devices sizes with a total of 16 parameters (2 for each transistor). The experiment generated with the circuit simulator (e.g., circuit simulator 220) results in a total of 5000 distinct input-output pairs at various process corners, supply voltages, operating temperatures, and devices sizes. The size of the training set is far smaller than the number of simulations runs needed for traditional robust optimization.

A. Experiment 1: Minimizing Common Mode Offset Voltage

Figure 10:
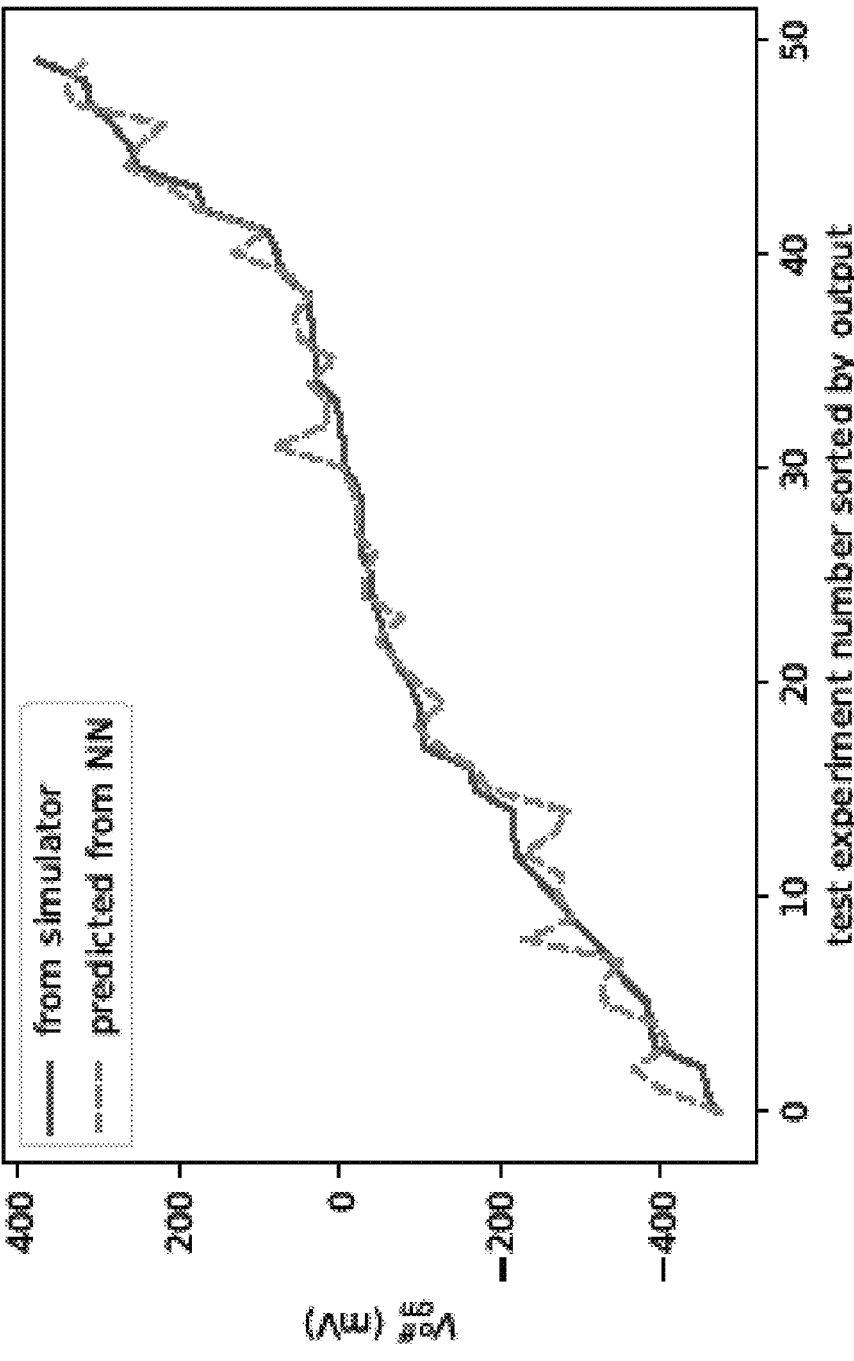
FIG. 10 is a graph of the output from the neural network on the testing set as compared with circuit simulator data on the testing set from the circuit simulator for Experiment 1 in accordance with one or more embodiments of the present invention.

A search space is considered similar to the one considered by the manual tuning method, and designed parameters $I_d$ were picked to be a set of 16 parameters described above with corresponding search space $D \subset \times_{p \in I} X_d$. The search space was limited to lie within a reasonable range resulting in $\approx 3.8 \times 10^{11}$ possible combinations in D. The environment parameters $I_p$ are process corners, supply voltage, and operating temperature as noted above. From the 5000 simulations results for various input parameters $I = I_d \cup I_p$, 4950 of these results were used for training and 50 for testing. As the neural network 226, a multi-layer perceptron (MLP) with 7 layers was used with a total of 2070 neurons and 602369 weights with rectified linear unit (ReLu) activation functions. The results of the training are shown in FIG. 10 where the neural network can predict $$V_{cm}^{off}$$

very well when it is small. Although the prediction of $$V_{cm}^{off}$$

could be less accurate for larger $$V_{cm}^{off},$$

this is not a problem because the goal of this experiment is to find parameters where $$V_{cm}^{off}$$

is small. For Experiment 1, FIG. 10 is a graph of the output from the neural network on the testing set as compared with the circuit simulator data on the testing set from the circuit simulator.

After training, the experiment defined an objective function (e.g., objective function 224) of interest. For this experiment, the interest is in minimizing the common mode offset voltage $$V_{cm}^{off}$$

among process corners. Selected are a set of process corners $P \subset \times_{p \in I_p} X_p$ to vary among 37 PVT values, and the objective function is defined as $$f(x) = \max_{y \in D} V_{cm}^{off}(x, y).$$

The resulting optimization problem is the minimax problem:

$$\min_{x \in D} f(x) = \min_{x \in D} \max_{y \in P} V_{cm}^{off}(x, y).$$

Rather than computing $$V_{cm}^{off}(x, y)$$

using a circuit simulator (e.g., circuit simulator 220), the experiment used the trained neural network (e.g., trained model 228) in inference mode which is much faster than the circuit simulator. This allowed the experimenters to use global optimization heuristics (e.g., via global optimization algorithm 222) to obtain an optimal solution (e.g., optimal solution/design 242) in a reasonable amount of time. Typical global optimization heuristics require many objective function evaluations which would be time-prohibitive if obtained using a traditional circuit simulator.

Figure 11:
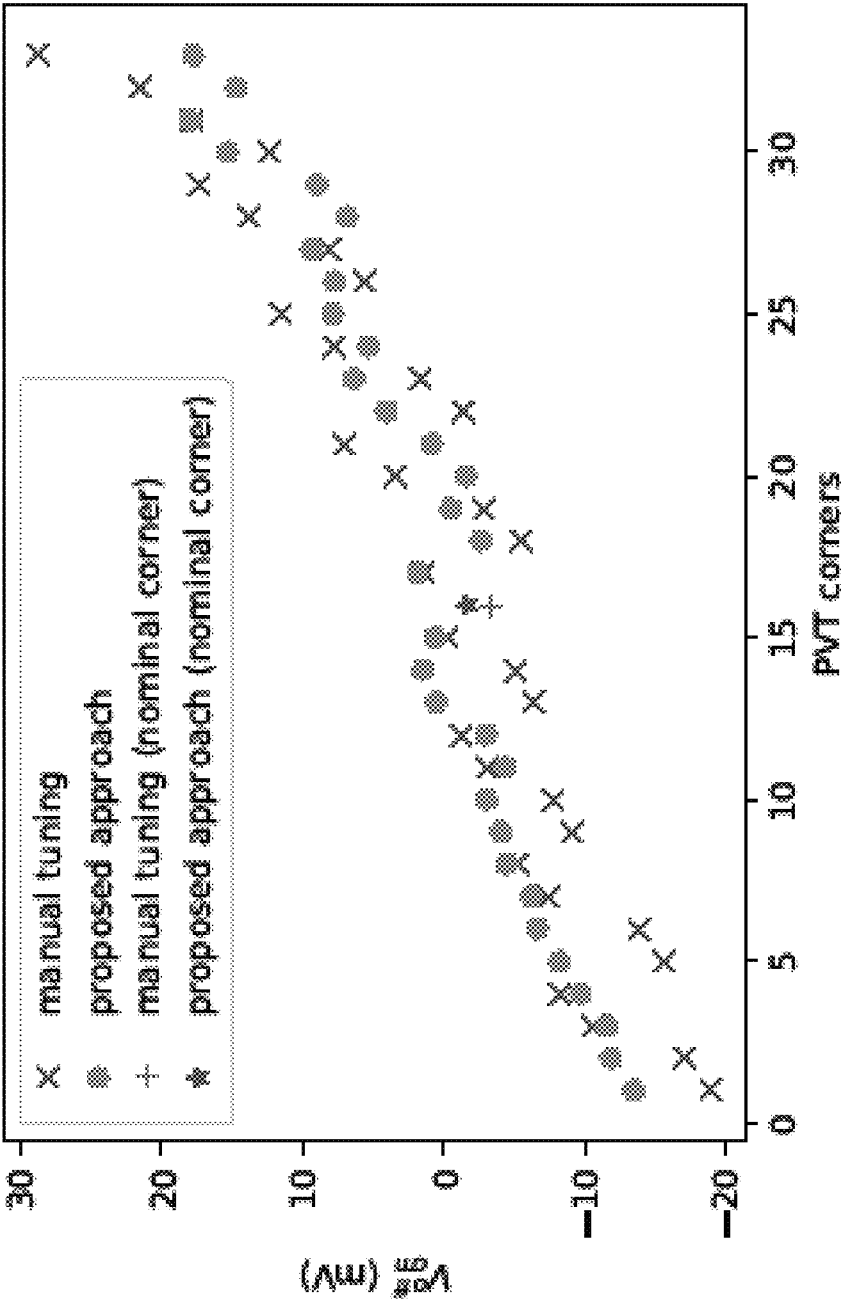
FIG. 11 is a graph of the common mode offset voltage for various operating values for a manually tuned design and the proposed approach design for Experiment 1 in accordance with one or more embodiments of the present invention.

Using this approach, the experimenters obtained a candidate set of circuit parameters that are validated with output from the circuit simulator (e.g., circuit simulator 220) because the predicted output (e.g., predicted output 240) from the neural network regressor is only an approximation of the actual output. The minimax global optimization problem is solved using a variant of differential evolution within a few hours resulting in a design that is superior to a hand-tuned design. The results are shown in FIG. 11 and Table 1. FIG. 11 is a graph illustrating $$V_{cm}^{off}$$

for various PVT values for the manually tuned design and the proposed approach design according to one or more embodiments, as computed by the circuit simulator. Although the trained neural network was used to obtain the optimal solution for the circuit design, the circuit simulator was used to verify values of the optimal solution for various PVT values against the manually tuned design.

TABLE 1

| $V_{cm}^{off}$ (mV) | nominal | minimum | maximum |
|---|---|---|---|
| Manually Tuned | −3.331 | −18.910 | 28.810 |
| Proposed Approach | −1.706 | −13.469 | 17.993 |

According to one or more embodiments of the invention, the proposed approach was able to improve on the nominal $$V_{cm}^{off},$$

but also significantly reduced the maximal and minimal $$V_{cm}^{off}.$$

Furthermore, the predicted offset voltages from the neural network were close to the offset voltages computed by the circuit simulator. In addition, the optimal design is less variable among the various PVT corners demonstrating that the optimized circuit is more robust against process variations.

Additionally, a Monte Carlo analysis using the circuit simulator is performed for these two designs at supply voltage $V_S=0.9V$ and operating temperature T=85° C. for 1024 sampled process variations. A smaller variance was found for the optimized design of the proposed approach according to one or more embodiments versus the manually tuned design.

Further, in Experiment 1 of the common-mode offset voltage optimization, Each objective function evaluation corresponds to finding the worst offset voltage among 37 PVT corners where the neural network took 1.7 milliseconds versus 26 minutes using the circuit simulator (e.g., SPECTRE circuit simulator) resulting in 910,000 times speedup.

B. Experiment 2: Longer Channel Devices

In Experiment 2, the purpose is to determine whether a good design exist with the same charge pump circuit (e.g., layout/deign 230) when some of the field effect transistors (FETs) are longer channel FETs. All devices of the same targeted circuit (e.g., layout/deign 230) as in Experiment 1 including bias circuity, charge pump slices, and common mode amplifier are converted to longer channel FETs. For Experiment 2, the experimenters used the criteria that a design is good if the worst-case value of $$|V_{cm}^{off}|$$

among all the PVT corners is less than 30 mV (millivolts). Manual tuning with the same tunable parameters as Experiment 1 was not successful in obtaining a design satisfying this criteria. This is because the catch diode devices (which produce the equal amount of reference current regarding device sizes) were not chosen to be varied in Experiment 1. Following upon the result from Experiment 1, Experiment 2 now opens the entire targeted circuit to be tuned. Hence, designed parameters $I_d$ are augmented with 2 additional parameters. This is now a fully parameterized design as all device sizes in the targeted circuit are made tunable. With these additional design parameters, there are $\approx 9.5 \times 10^{12}$ combinations in search space D.

Figure 12:
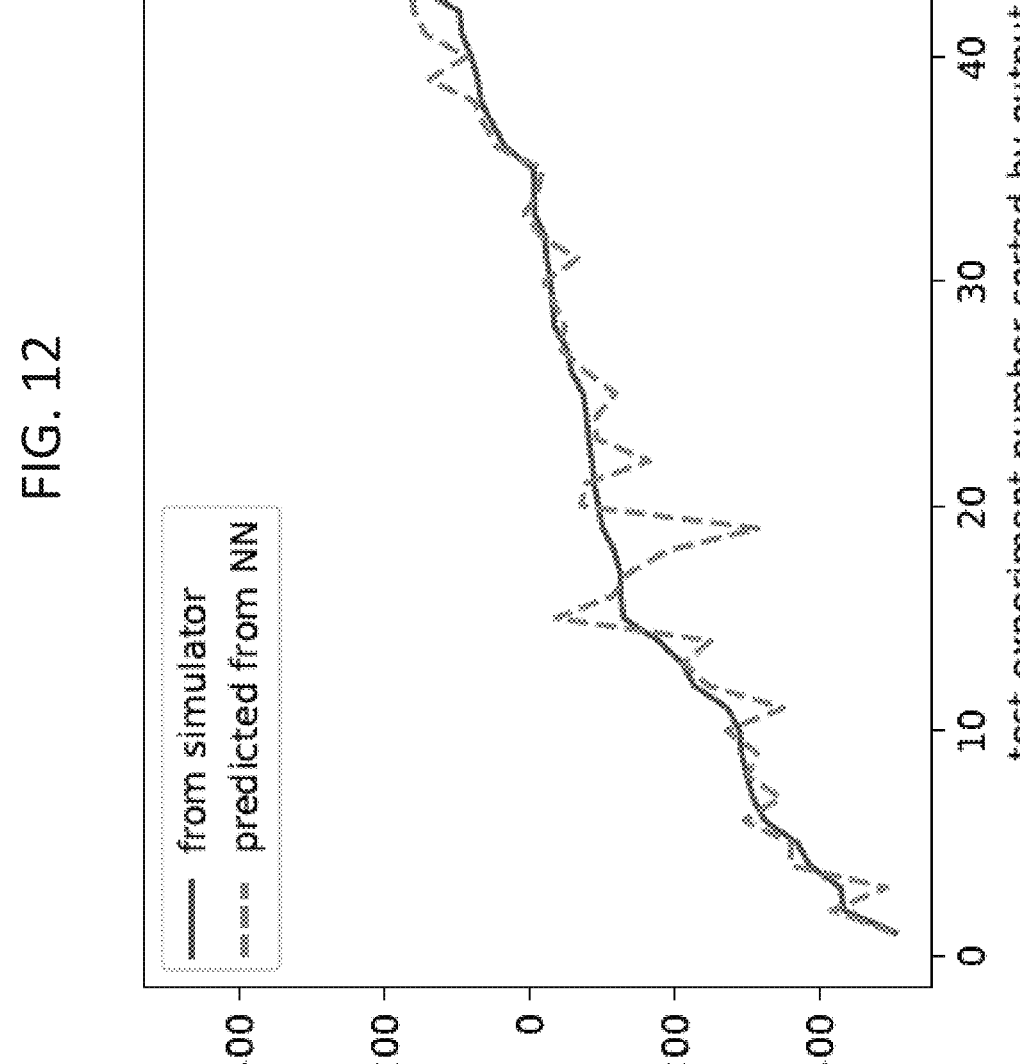
FIG. 12 is a graph of the output from the neural network on the testing set as compared with circuit simulator data on the testing set from the circuit simulator for Experiment 2 in accordance with one or more embodiments of the present invention.

In Experiment 2, a bigger MLP neural network (e.g., neural network 226) was used with 2326 neurons and 804,865 weights while the same process is applied as before, and FIG. 12 shows the output from the neural network 226 on the testing set as compared with simulator data on the testing set. Because there are more input parameters, it can be seen that the prediction on the testing set for $$V_{cm}^{off}$$

is not as good as in Experiment 1, but this could be also be due to $$V_{cm}^{off}$$

having a more complicated relationship with the input parameters for longer channel transistor devices. The system 200 produces an optimal circuit design with $$V_{cm}^{off}$$

equal to −5.5 mV, −11.8 mV, and 15.6 mV at nominal, minimum, and maximum respectively among the PVT corners which is well within the acceptable criteria.

C. Experiment 3: Phase Margin Optimization

Experiment 3 is considered a more challenging circuit tuning problem. The output parameter is the phase margin of the common mode sense loop. Phase margin is a measure of the stability margin of this circuit during alternating current (AC) analysis and a larger phase margin is more desirable for a robust circuit design. The goal is to maximize the minimal phase margin across process parameters within a frequency range and at various operating conditions. Some of the input parameters are capacitance and resistance values at various circuit nodes, instead of device sizes as in previous experiments. Other input parameters are additional circuit operational conditions, such as initial voltage conditions at the beginning of a transient analysis (after which the AC analysis starts), and parameters to depict input stimuli for certain voltage sources. Other input parameters include loading conditions, such as the values of output capacitance and resistance as load.

As before, Experiment 3 generated 1000 simulation results sampled randomly from the input parameter space and simulated them for each of the 5 process corners resulting in 5000 simulation results. The prediction error when the phase margin is low with this training data is relatively large. This is considered problematic because Experiment 3 is maximizing the minimal phase margin, so the error for low phase margin will cause large errors in the objective function. Accordingly, Experiment 3 augmented the training set and testing set with an additional 2500 simulation results that include process and operating parameters that are known to generate low phase margin, thereby resulting in a revised testing error indicating a good predictive error. The average absolute prediction error of the phase margin on the test set is 1.6 degrees.

The 7-layer MLP neural network (e.g., neural network 226) used has a total of 4096 neurons and 2,382,377 weights. After the neural network is trained, an objective function (e.g., objective function 224) of interest is defined. For Experiment 3, the goal is to maximize the minimum phase margin $\varphi$ across process corners and a series of operating conditions. Selected were a set of process corners $P \subset \times_{p \in I_p} X_p$ to vary among 37 PVT values along with multiple operating conditions and parameters. The objective function is defined as $f(x)=-\min_{y \in P}\varphi(x,y)$. The resulting optimization problem is the minimax MIP problem: $\min_{x \in D} f(x)=-\max_{x \in D} \min_{y \in P}\varphi(x,y)$, where designed parameters $I_d$ contains both discrete and continuous variable for Experiment 3. Since Experiment 3 needed to sweep through all PVT corners and multiple operating conditions, the number of combinations in P can be quite large. In this case, the set P consists of about 8000 elements and thus is impractical to evaluate f(x) many times using a circuit simulator (e.g., circuit simulator 22), because it would involve 8000 simulations per function evaluation. However, the neural network can generate data that are used to evaluate f very quickly according to one or more embodiments.

Furthermore, since the first step of neural network inference is to multiply the input vector by a weight matrix, the input parameters for each P can be stacked into a matrix and the computation of the neural network output needed to evaluate f is vectorized, i.e., all 8000 sets of parameters are fed into the neural network at the same time. More precisely, let P be 1 parameter sets of length m. The experiment precomputed a matrix P of size l×m, one row per parameter set. In order to evaluate f, for each x, $Q=J \otimes x$ was constructed where J is the all 1's vector of length l, $\otimes$ is the Kronecker matrix product, and the matrix [P|Q] is evaluated by the neural network. The output from the neural network is a vector of length l containing $\varphi(x)$ for each x (or a l×d matrix if the output for each input is a d-vector). The negative of the minimum of this vector is then returned as f(x).

Figure 13:
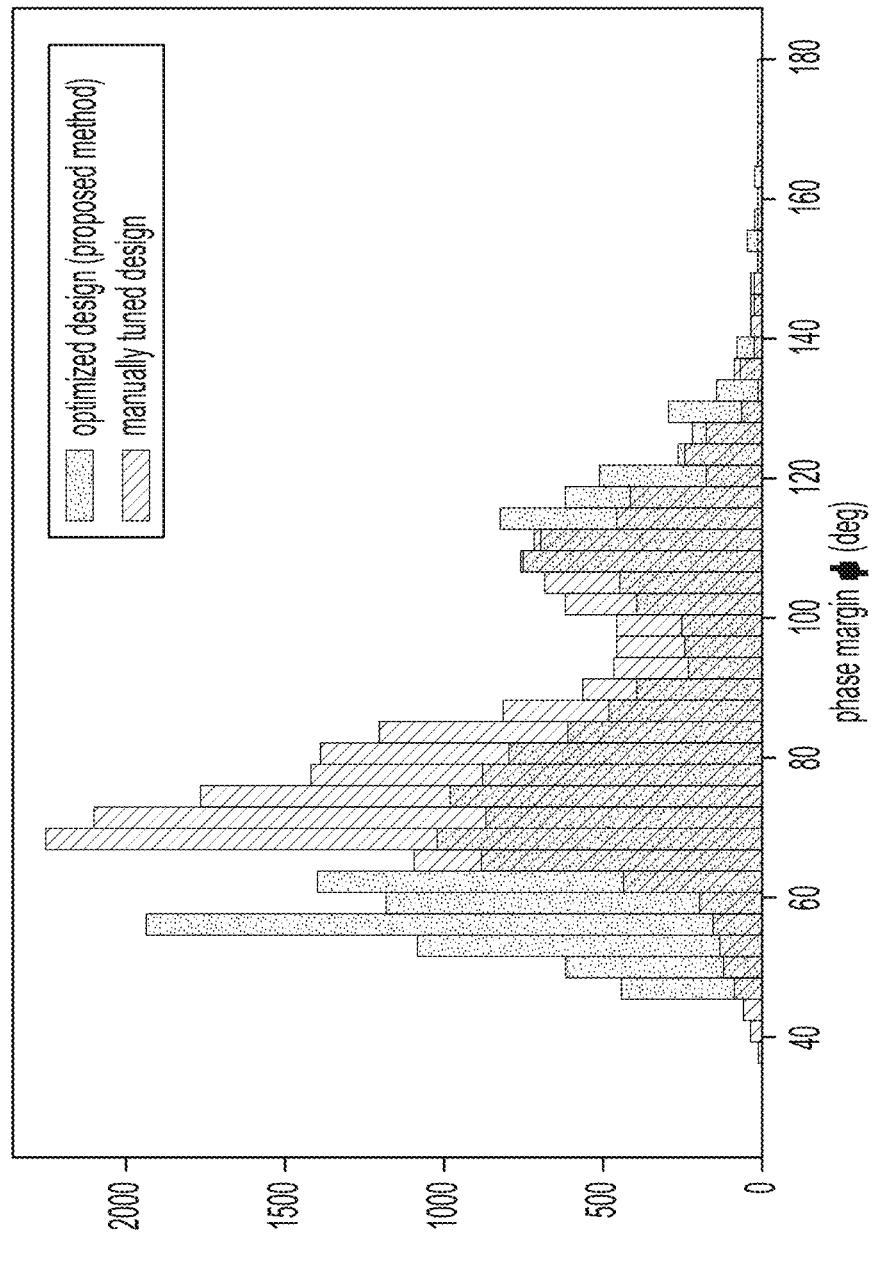
FIG. 13 is a histogram of phase margin across various values for the manually tuned design and the optimized design of the proposed approach for Experiment 2 in accordance with one or more embodiments of the present invention.

It was found that this approach in accordance with one or more embodiments resulted in a design that is superior to a manually tuned design. The results are shown in FIG. 13 where there is shown a histogram of the phase margin φ of the optimal design across the process parameters for over 20000 combinations of PVT corners and operating conditions in $x_{p \in I_p}$ $X_p$. Particularly, FIG. 13 is a histogram of phase margin across combinations of all cases of PVT corners and operating conditions for the manually tuned design and the optimized design of the proposed approach according to one or more embodiments. Also, it can be seen in Table 2 that the proposed approach according to one or more embodiments was able to significantly increase the minimal φ from 36.28 degrees to 46.07 degrees. Furthermore, the differences between the predicted minimal φ from the neural network and the minimal φ from the circuit simulator for these designs are in line with the average error observed on the testing set.

TABLE 2

| Minimal Phase Margin (deg) | Predicted From Neural Network | Predicted From Circuit Simulator |
|---|---|---|
| Manually tuned design | 38.96° | 36.28° |
| Proposed approach design | 46.26° | 46.07° |

FIG. 14 is a block diagram of a system 1400 (which can include functionality and/or be integrated with functionality of system 200) to perform automatic robust optimization of circuits according to embodiments of the invention. The system 1400 includes processing circuitry 1410 used to generate the design that is ultimately fabricated into an integrated circuit 1420. The steps involved in the fabrication of the integrated circuit 1420 are well-known and briefly described herein. Once the physical layout 1430 is finalized, based, in part, on the automatic robust optimization of circuits (resulting in the values of the optimal solution incorporated in the layout/design 230) according to embodiments of the invention to facilitate optimization of the routing plan, the finalized physical layout is provided to a foundry. Masks 1440 are generated for each layer of the integrated circuit based on the finalized physical layout. Then, the wafer is processed in the sequence of the mask order. The processing includes photolithography and etch. This is further discussed with reference to FIG. 14.

Figure 15:
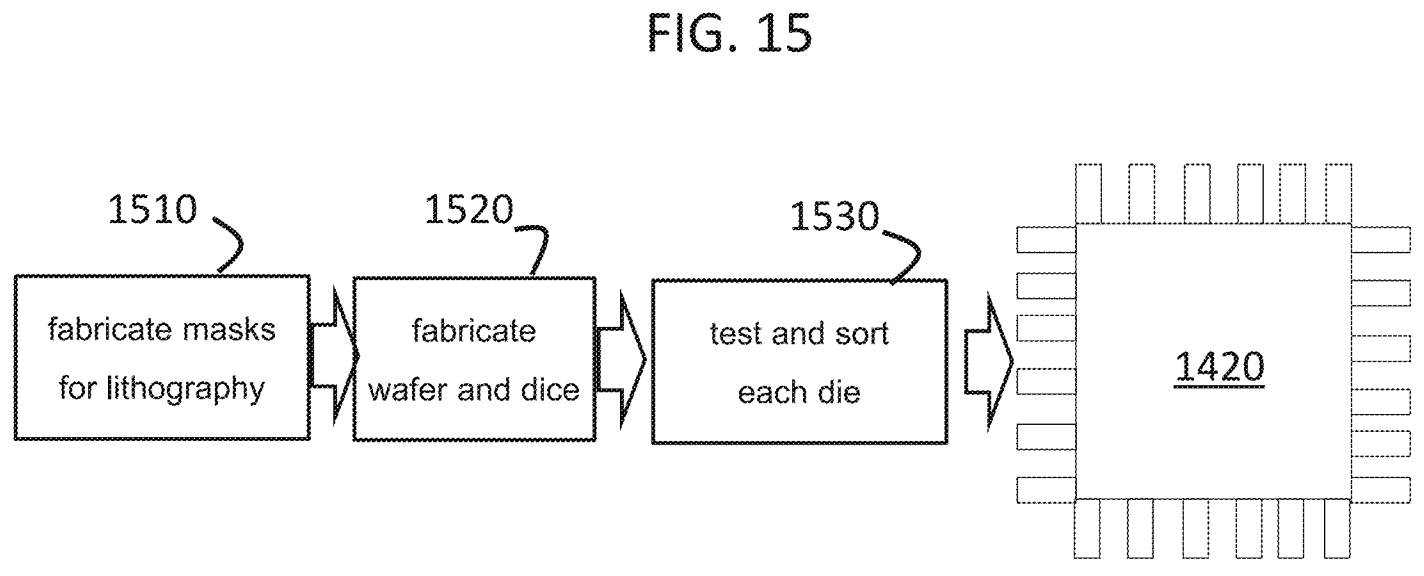

FIG. 15 is a process flow of a method of fabricating the integrated circuit according to exemplary embodiments of the invention. Once the physical design data is obtained, based, in part, on the automatic robust optimization of circuits (resulting in the values of the optimal solution incorporated in the layout/design 230), the integrated circuit 1420 can be fabricated according to known processes that are generally described with reference to FIG. 15. Generally, a wafer with multiple copies of the final design is fabricated and cut (i.e., diced) such that each die is one copy of the integrated circuit 1420. At block 1510, the processes include fabricating masks for lithography based on the finalized physical layout. At block 1520, fabricating the wafer includes using the masks to perform photolithography and etching. Once the wafer is diced, testing and sorting each die is performed, at block 1530, to filter out any faulty die.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 16:
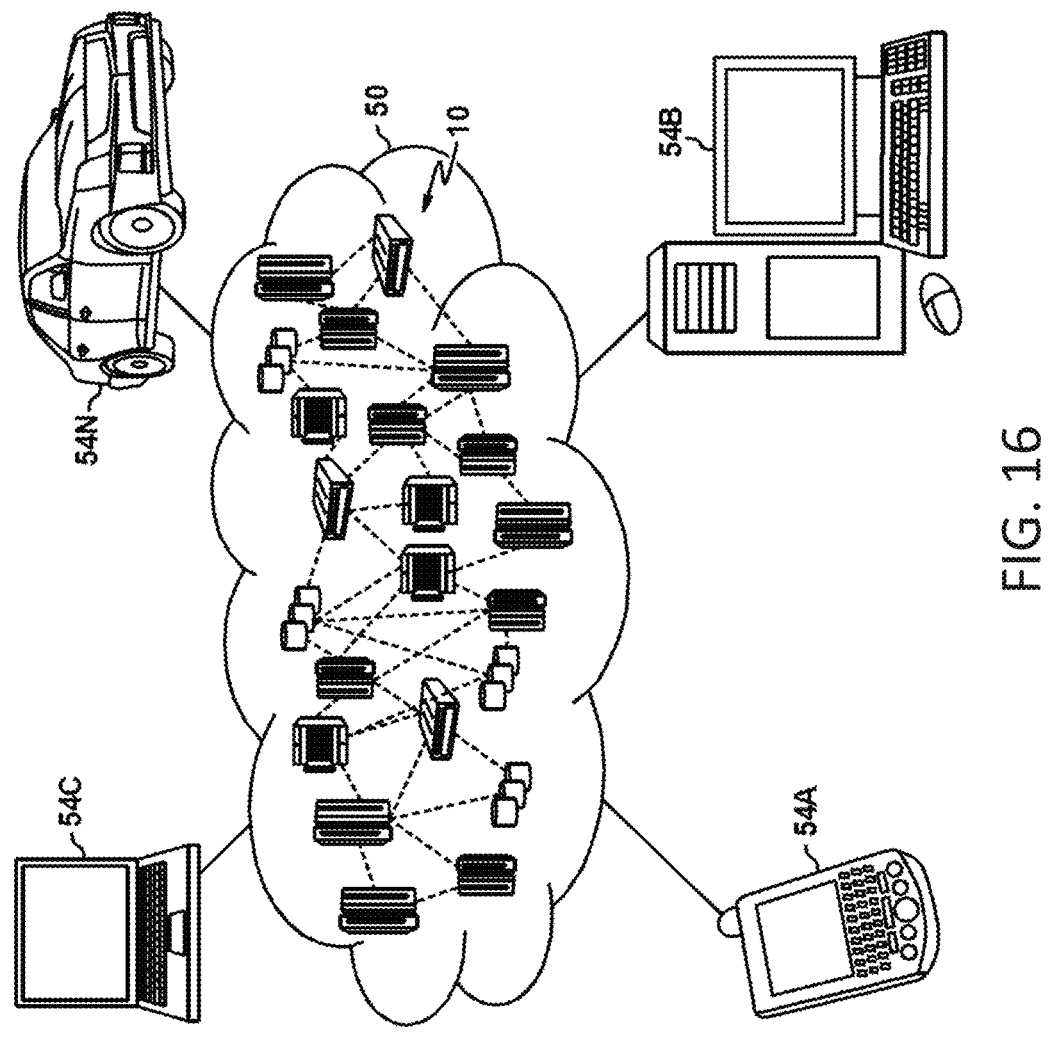
FIG. 16 depicts a cloud computing environment according to one or more embodiments of the present invention.

Referring now to FIG. 16, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described herein above, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 16 are intended to be illustrative only and that computing nodes 10 and cloud computing environment 50 can communicate with any type of computerized device over any type of network and/or network addressable connection (e.g., using a web browser).

Figure 17:
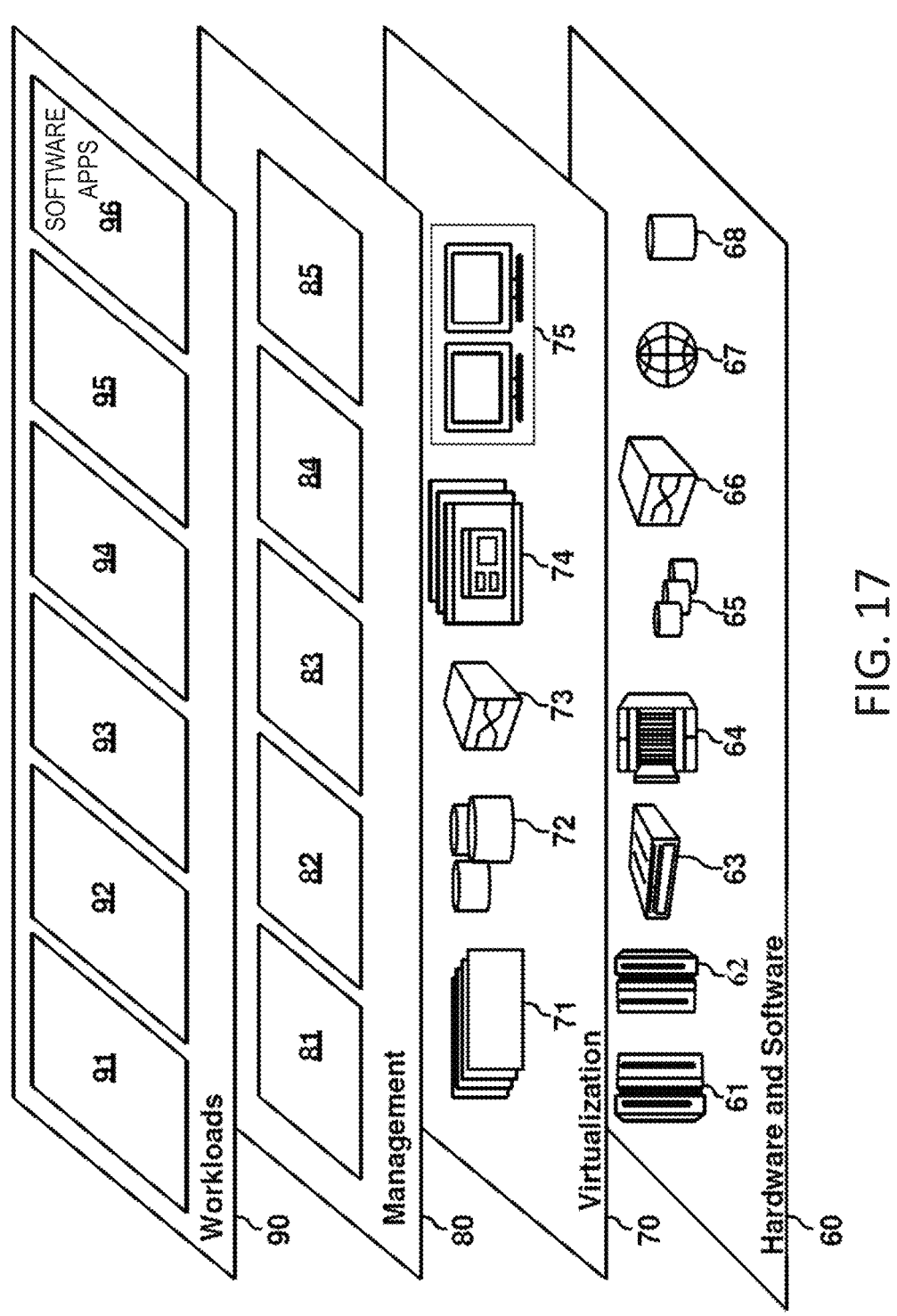
FIG. 17 depicts abstraction model layers according to one or more embodiments of the present invention.

Referring now to FIG. 17, a set of functional abstraction layers provided by cloud computing environment 50 (FIG. 16) is shown. It should be understood in advance that the components, layers, and functions shown in FIG. 17 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and software applications (e.g., software applications 204, graphical user interface 206, circuit simulator 220, global optimization algorithm 222, objection functions 224, neural network 226, trained model 228, and layout/design 230, etc.) implemented in workloads and functions 96.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method for a circuit design of an integrated circuit, the method comprising:

executing a trained neural network to generate predicted circuit data for the circuit design, wherein the predicted circuit data comprises predicted input and output pairs, wherein the trained neural network is trained on training data of process corners for circuit designs, the training data comprising circuit simulator data generated by executing a circuit simulator, the circuit simulator data comprising training input and output pairs that are input to the trained neural network, wherein the predicted circuit data output from the trained neural network comprises a phase margin or common mode offset voltage;

in response to receiving an objective function based on the predicted input and output pairs and in response to receiving an optimal solution based on the objective function, executing the circuit simulator to validate the optimal solution for the circuit design such that validation results are fed back to the trained neural network for reinforcement learning, wherein the validation results for the circuit design are compared to the predicted circuit data comprising the phase margin or the common mode offset voltage of the neural network for the reinforcement learning; and mapping the optimal solution to circuit elements of the circuit design.

2. The computer-implemented method of claim 1, wherein the trained neural network is executed based on input comprising resistance, capacitance, device size, temperature, supply voltage, supply current, and a process corner for the circuit design.

3. The computer-implemented method of claim 1, wherein values of the optimal solution are inserted into the circuit simulator for a resistance, a capacitance, and a transistor to generate the validation results.

4. The computer-implemented method of claim 1, wherein the optimization is performed using a genetic algorithm.

5. The computer-implemented method of claim 1, wherein the optimization is performed using a swarm optimization algorithm.

6. The computer-implemented method of claim 1, wherein the optimization is performed using a Bayes black box optimization algorithm.

7. The computer-implemented method of claim 1, wherein the objective function is computed using a Monte Carlo analysis.

8. The computer-implemented method of claim 1, wherein the objective function is computed as a worst-case solution among process corners and operating conditions.

9. The computer-implemented method of claim 1, further comprising:

generating the circuit simulator data in a parameter space for the circuit design, wherein the predicted circuit data output from the trained neural network comprises power.

10. A system comprising:

a memory having computer readable instructions; and one or more processors for executing the computer readable instructions, the computer readable instructions controlling the one or more processors to perform operations comprising:

executing a trained neural network to generate predicted circuit data for a circuit design, wherein the predicted circuit data comprises predicted input and output pairs, wherein the trained neural network is trained on training data of process corners for circuit designs, the training data comprising circuit simulator data generated by executing a circuit simulator, the circuit simulator data comprising training input and output pairs that are input to the trained neural network, wherein the predicted circuit data output from the trained neural network comprises a phase margin or common mode offset voltage;

in response to receiving an objective function based on the predicted input and output pairs and in response to receiving an optimal solution based on the objective function on the objective function, executing the circuit simulator to validate the optimal solution for the circuit design such that validation results are fed back to the trained neural network for reinforcement learning, wherein the validation results for the circuit design are compared to the predicted circuit data comprising the phase margin or the common mode offset voltage of the neural network for the reinforcement learning; and mapping the optimal solution to circuit elements of the circuit design.

11. The system of claim 10, wherein the trained neural network is executed based on input comprising resistance, capacitance, device size, temperature, supply voltage, supply current, and a process corner for the circuit design.

12. The system of claim 10, wherein values of the optimal solution are inserted into the circuit simulator for a resistance, a capacitance, and a transistor to generate the validation results.

13. The system of claim 10, wherein the optimization is performed using a genetic algorithm.

14. The system of claim 10, wherein the optimization is performed using a swarm optimization algorithm.

15. The system of claim 10, wherein the optimization is performed using a Bayes black box optimization algorithm.

16. The system of claim 10, wherein the objective function is computed using a Monte Carlo analysis.

17. The system of claim 10, wherein the objective function is computed as a worst-case solution among process corners and operating conditions.

18. A computer program product comprising a non-transitory computer readable storage medium having program instructions embodied therewith, the program instructions executable by a processor to cause the processor to perform operations comprising:

executing a trained neural network to generate predicted circuit data for a circuit design, wherein the predicted circuit data comprises predicted input and output pairs, wherein the trained neural network is trained on training data of process corners for circuit designs, the training data comprising circuit simulator data generated by executing a circuit simulator, the circuit simulator data comprising training input and output pairs that are input to the trained neural network, wherein the predicted circuit data output from the trained neural network comprises a phase margin or common mode offset voltage;

in response to receiving an objective function based on the predicted input and output pairs and in response to receiving an optimal solution based on the objective function, executing the circuit simulator to validate the optimal solution for the circuit design such that validation results are fed back to the trained neural network for reinforcement learning, wherein the validation results for the circuit design are compared to the predicted circuit data comprising the phase margin or the common mode offset voltage of the neural network for the reinforcement learning; and mapping the optimal solution to circuit elements of the circuit design.

19. The computer program product of claim 18, wherein the trained neural network is executed based on input comprising resistance, capacitance, device size, temperature, supply voltage, supply current, and a process corner for the circuit design.

20. The computer program product of claim 18, wherein values of the optimal solution are inserted into the circuit simulator for a resistance, a capacitance, and a transistor to generate the validation results.

21. The computer program product of claim 18, wherein the optimization is performed using a selection from the group consisting of a genetic algorithm, a swarm optimization algorithm, and a Bayes black box optimization algorithm.

22. The computer program product of claim 18, wherein the objective function is computed using a Monte Carlo analysis.

23. The computer program product of claim 18, further comprising generating the circuit simulator data in a parameter space for the circuit design, wherein the predicted circuit data output from the trained neural network comprises power.

24. A computer-implemented method for using a graphical user interface for tuning a circuit design comprising:

executing, using the graphical user interface, a selection configured to train a neural network using circuit simulator data in a parameter space for the circuit design, the circuit simulator data being from a circuit simulator, wherein the neural network is used to generate predicted circuit data for the circuit design, wherein the predicted circuit data comprises predicted input and output pairs, wherein the trained neural network is trained on training data of process corners for circuit designs, the circuit simulator data comprising training input and output pairs that are input to the trained neural network, wherein the predicted circuit data output from the trained neural network comprises a phase margin or common mode offset voltage;

in response to using the graphical user interface to receive an objective function based on the predicted input and output pairs and in response to receiving an optimal solution based on the objective function, executing the circuit simulator to validate the optimal solution for the circuit design such that validation results are fed back to the trained neural network for reinforcement learning, wherein the validation results for the circuit design are compared to the predicted circuit data comprising the phase margin or the common mode offset voltage of the neural network for the reinforcement learning.

25. A system for using a graphical user interface for tuning a circuit design comprising:

a memory having computer readable instructions; and one or more processors for executing the computer readable instructions, the computer readable instructions controlling the one or more processors to perform operations comprising:

executing, using the graphical user interface, a selection configured to train a neural network using circuit simulator data in a parameter space for the circuit design, the circuit simulator data being from a circuit simulator, wherein the neural network is used to generate predicted circuit data for the circuit design, wherein the predicted circuit data comprises predicted input and output pairs, wherein the trained neural network is trained on training data of process corners for circuit designs, the circuit simulator data comprising training input and output pairs that are input to the trained neural network, wherein the predicted circuit data output from the trained neural network comprises a phase margin or common mode offset voltage;

in response to using the graphical user interface to receive an objective function based on the predicted circuit data and in response to receiving an optimal solution based on the objective function, executing the circuit simulator to validate the optimal solution for the circuit design such that validation results are fed back to the trained neural network for reinforcement learning, wherein the validation results for the circuit design are compared to the predicted circuit data comprising the phase margin or the common mode offset voltage of the neural network for the reinforcement learning.

* * * * *